United States Patent
Sampath Kumar et al.

(10) Patent No.: US 12,557,574 B2
(45) Date of Patent: Feb. 17, 2026

(54) TREATMENT METHODS FOR SILICON NANOSHEET SURFACES USING HYDROGEN RADICALS

(71) Applicant: Applied Materials, Inc., Santa Clara, CA (US)

(72) Inventors: Pradeep Sampath Kumar, San Jose, CA (US); Norman L. Tam, Cupertino, CA (US); Shashank Sharma, Fremont, CA (US); Zhiming Jiang, Pleasonton, CA (US); Jingmin Leng, Fremont, CA (US); Victor Calderon, Sunnyvale, CA (US); Mahesh Ramakrishna, Bengaluru (IN)

(73) Assignee: Applied Materials, Inc., Santa Clara, CA (US)

( * ) Notice: Subject to any disclaimer, the term of this patent is extended or adjusted under 35 U.S.C. 154(b) by 711 days.

(21) Appl. No.: 17/886,269

(22) Filed: Aug. 11, 2022

(65) Prior Publication Data
US 2024/0055265 A1    Feb. 15, 2024

(51) Int. Cl.
*H01L 21/3065* (2006.01)
*H01J 37/32* (2006.01)
(Continued)

(52) U.S. Cl.
CPC .... *H01L 21/3065* (2013.01); *H01J 37/32357* (2013.01); *H01J 37/32422* (2013.01);
(Continued)

(58) Field of Classification Search
CPC .......... H01J 37/32357; H01J 37/32422; H01J 37/32449; H01J 2237/2001; H01J 2237/335; H01L 21/02532; H01L 21/0259; H01L 21/02603; H01L 21/0262; H01L 21/02631; H01L 21/302; H01L 21/30604; H01L 21/3065; H01L 21/321; H01L 21/324; H01L 21/3247; H01L 21/67207; H10D 30/01; H10D 30/014; H10D 30/017; H10D 30/019–0198; H10D 30/024;
(Continued)

(56) References Cited

U.S. PATENT DOCUMENTS 10,002,759 B2    6/2018  Bao et al.
10,177,227 B1    1/2019  Yoshida et al.
(Continued)

*Primary Examiner* — Cheung Lee
(74) *Attorney, Agent, or Firm* — Patterson + Sheridan, LLP

(57) ABSTRACT

A method and apparatus for forming a semiconductor device are provided. The method includes thermally treating a substrate having one or more silicon nanosheets formed thereon. Thermally treating the substrate includes positioning the substrate in a processing volume of a first processing chamber, the substrate having one or more silicon nanosheets formed thereon. Thermally treating the substrate further includes heating the substrate to a first temperature of more than about 250 degrees Celsius, generating hydrogen radicals using a remote plasma source fluidly coupled with the processing volume, and maintaining the substrate at the first temperature while concurrently exposing the one or more silicon nanosheets to the generated hydrogen radicals. The generated hydrogen radicals remove residual germanium from the one or more silicon nanosheets.

20 Claims, 12 Drawing Sheets

(51) Int. Cl.
  *H01L 21/67*  (2006.01)
  *H10D 30/01*  (2025.01)
  *H10D 64/01*  (2025.01)
  *H10D 30/67*  (2025.01)
  *H10D 62/10*  (2025.01)

(52) U.S. Cl.
  CPC .. *H01J 37/32449* (2013.01); *H01L 21/67207* (2013.01); *H10D 30/014* (2025.01); *H10D 30/031* (2025.01); *H10D 64/015* (2025.01); *H10D 64/018* (2025.01); *H01J 2237/2001* (2013.01); *H01J 2237/335* (2013.01); *H01L 21/67167* (2013.01); *H10D 30/6735* (2025.01); *H10D 62/121* (2025.01)

(58) Field of Classification Search
  CPC ............ H10D 30/0273; H10D 30/031; H10D 30/0312; H10D 30/0318; H10D 30/43; H10D 30/435; H10D 30/501–509; H10D 30/62; H10D 30/6735; H10D 30/674; H10D 30/6757; H10D 62/121; H10D 62/815; H10D 64/015; H10D 64/017; H10D 64/018
  See application file for complete search history.

(56) References Cited

U.S. PATENT DOCUMENTS

| | | |
|---|---|---|
| 10,205,002 B2 | 2/2019 | Bao et al. |
| 2016/0336405 A1 | 11/2016 | Sun et al. |
| 2017/0194430 A1 | 7/2017 | Wood et al. |
| 2021/0028280 A1 | 1/2021 | Liu et al. |
| 2021/0233997 A1* | 7/2021 | Chen ................ H01L 21/31116 |
| 2022/0108914 A1 | 4/2022 | Zhang et al. |
| 2022/0238650 A1 | 7/2022 | Wu et al. |
| 2022/0251708 A1 | 8/2022 | Zhang et al. |
| 2022/0310602 A1* | 9/2022 | Greene ................ H10D 62/115 |

* cited by examiner

TREATMENT METHODS FOR SILICON NANOSHEET SURFACES USING HYDROGEN RADICALS

TECHNICAL FIELD

The present disclosure relates to transistor devices and methods for manufacturing transistor devices. More particularly, the present disclosure relates to superlattice structures that may be used in gate-all around (GAA) transistor devices and methods for manufacturing the same.

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thus improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reducing OFF-state current, and reducing short-channel effects (SCEs). One such multi-gate device that has been introduced is the gate-all around transistor (GAA). In a GAA device all side surfaces of the channel region are surrounded by the gate electrode, which allows for fuller depletion in the channel region and results in less short-channel effects due to a steeper sub-threshold current swing and smaller drain induced barrier lowering (DIBL).

As transistor dimensions are scaled down to smaller technology nodes, there is a need for further improvements in GAA design and manufacturing.

SUMMARY

The present disclosure relates to transistor devices and methods for manufacturing transistor devices. More particularly, the present disclosure relates to superlattice structures that may be used in gate-all around (GAA) transistor devices and methods for manufacturing the same.

In one aspect, a method of forming a semiconductor device is provided. The method includes thermally treating a substrate having one or more silicon nanosheets formed thereon. Thermally treating the substrate includes positioning the substrate in a processing volume of a first processing chamber, heating the substrate to a first temperature of more than about 250 degrees Celsius, generating hydrogen radicals using a remote plasma source fluidly coupled with the processing volume, and maintaining the substrate at the first temperature while concurrently exposing the one or more silicon nanosheets to the generated hydrogen radicals.

Implementations may include one or more of the following. Generating the hydrogen radicals includes flowing hydrogen gas into the remote plasma source, igniting and maintaining a plasma of the hydrogen gas, and flowing an effluent of the remote plasma source into the processing volume, wherein the effluent includes hydrogen radicals. The method further includes removing, by use of an ion filter, hydrogen ions from the effluent of the remote plasma source before flowing the effluent into the processing volume. The generated hydrogen radicals remove residual germanium from the one or more silicon nanosheets. Flowing the hydrogen gas into the remote plasma source includes flowing the hydrogen gas into the remote plasma source at a flow rate in a range from about 50 sccm to about 100 sccm. The first temperature is in a range from about 450 degrees Celsius to about 500 degrees Celsius. The one or more silicon nanosheets include at least three nanosheets and the at least three nanosheets are part of a horizontally stacked gate-all-around nanosheet structure. The method further includes removing silicon germanium layers from a superlattice structure including the silicon germanium layers and silicon layers alternatingly arranged in a plurality of stacked pairs to form the silicon nanosheets, wherein the first processing chamber is connected to a second processing chamber by a transfer chamber disposed therebetween and removing the silicon germanium layers is performed via an etching process in the second processing chamber.

In another aspect, a method of forming silicon nanosheets in a transistor device is provided. The method includes positioning a substrate in a first processing volume, the substrate having a superlattice structure formed thereon, the superlattice structure including a plurality of silicon layers and a plurality of silicon germanium layers alternatingly arranged in a plurality of stacked pairs. The method further includes removing the plurality of silicon germanium layers from the superlattice structure to form a plurality of silicon nanosheets by exposing the superlattice structure to an etchant that removes silicon germanium at a higher rate than silicon. The method further includes positioning the substrate in a second processing volume of a second processing chamber that is connected to the first processing chamber. The method further includes heating the substrate to a first temperature of more than about 250 degrees Celsius. The method further includes generating hydrogen radicals using a remote plasma source fluidly coupled with the second processing volume. The method further includes maintaining the substrate at the first temperature while concurrently exposing the plurality of silicon nanosheets to the generated hydrogen radicals.

Implementations may include one or more of the following. The generated hydrogen radicals remove residual germanium from the plurality of silicon nanosheets. Generating the hydrogen radicals includes flowing hydrogen gas into the remote plasma source, igniting and maintaining a plasma of the hydrogen gas, and flowing an effluent of the remote plasma source into the second processing volume, wherein the effluent includes hydrogen radicals. The etchant includes an ammonia peroxide mixture or a sulfuric acid peroxide mixture. Removing, by use of an ion filter, hydrogen ions from the effluent of the remote plasma source before flowing the effluent into the second processing volume. Flowing the hydrogen gas into the remote plasma source includes flowing the hydrogen gas into the remote plasma source at a flow rate in a range from about 50 sccm to about 100 sccm. The first temperature is in a range from about 450 degrees Celsius to about 500 degrees Celsius. The plurality of silicon nanosheets include at least three nanosheets and the at least three nanosheets are part of a horizontally stacked gate-all-around nanosheet structure.

In yet another aspect, a method of forming silicon nanosheets in a transistor device is provided. The method includes forming a superlattice structure on a substrate, wherein the superlattice structure includes a plurality of silicon layers and a plurality of silicon germanium layers alternatingly arranged in a plurality of stacked pairs. The method further includes patterning and etching the superlattice structure to form fins from the superlattice structure. The fins are separated by trenches. The method further includes depositing a dielectric material in the trenches to form shallow trench isolation (STI) structures. The method further includes exposing sidewalls of the fins by recessing the STI structures to form recessed STI structures. The method further includes forming a dummy gate oxide layer over the fins and the recessed STI structure. The method further includes forming a dummy metal gate stack over the dummy gate oxide layer. The method further includes removing the plurality of silicon germanium layers from the fins to form a plurality of silicon nanosheets by exposing the fins to an etchant that removes silicon germanium at a higher rate than silicon. The method further includes heating the substrate to a first temperature of more than about 250 degrees Celsius. The method further includes maintaining the substrate at the first temperature while concurrently exposing the plurality of silicon nanosheets to hydrogen radicals, wherein the hydrogen radicals are generated using a remote plasma source.

Implementations may include one or more of the following. The generated hydrogen radicals remove residual germanium from the one or more silicon nanosheets. Generating the hydrogen radicals using the remote plasma source includes flowing hydrogen gas into the remote plasma source, igniting and maintaining a plasma of the hydrogen gas, and flowing an effluent of the remote plasma source into a processing volume, wherein the effluent includes hydrogen radicals. The method further includes removing, by use of an ion filter, hydrogen ions from the effluent of the remote plasma source before flowing the effluent into the processing volume.

In another aspect, a non-transitory computer readable medium has stored thereon instructions, which, when executed by a processor, causes the process to perform operations of the above apparatus and/or method.

BRIEF DESCRIPTION OF THE DRAWINGS

So that the manner in which the above-recited features of the present disclosure can be understood in detail, a more particular description of the aspects, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1A:
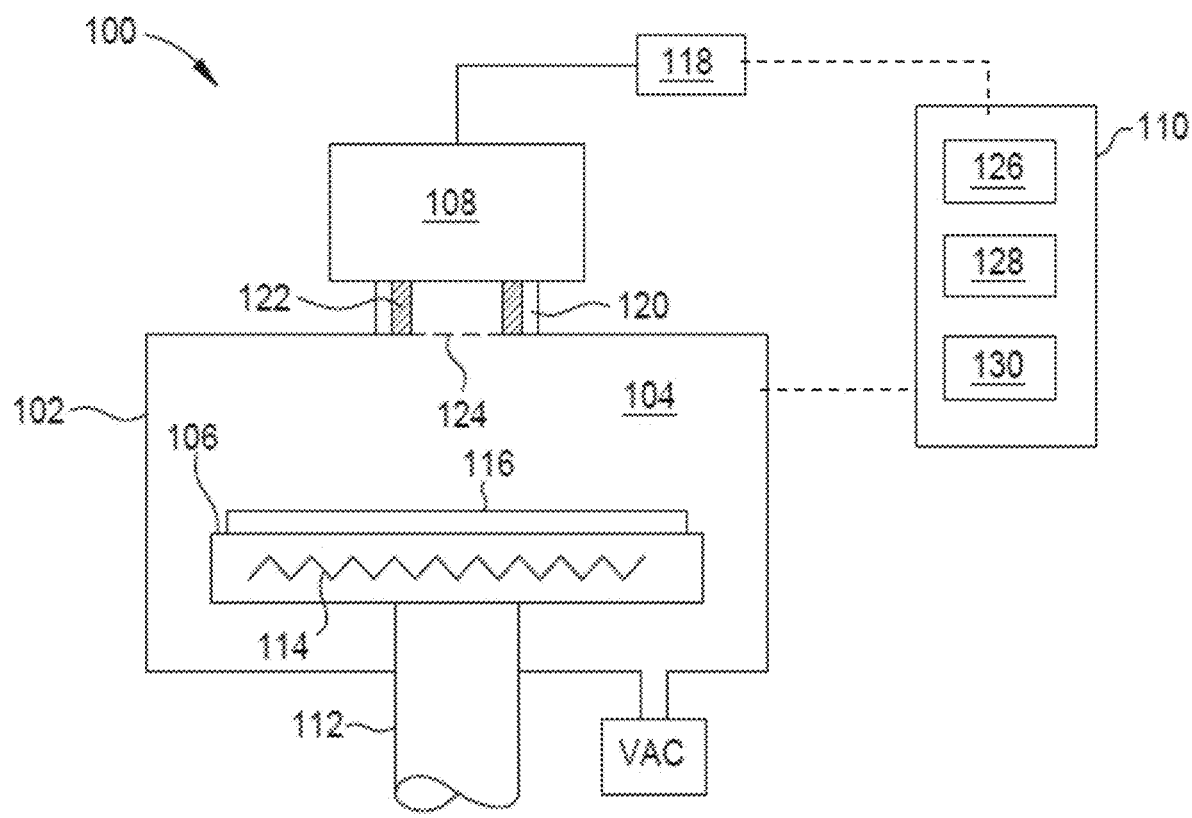
FIGS. 1A and 1B illustrate schematic sectional views of exemplary processing chambers which may be used to perform the methods set forth herein in accordance with one or more implementations of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

In the Summary above and in the Detailed Description, and the claims below, and in the accompanying drawings, reference is made to particular features (including method operations) of the present disclosure. It is to be understood that the disclosure in this specification includes all possible combinations of such particular features. For example, where a particular feature is disclosed in the context of a particular aspect or implementation of the present disclosure, or a particular claim, that feature can also be used, to the extent possible in combination with and/or in the context of other particular aspects and implementations of the present disclosure, and in the present disclosure generally.

The terms "comprising," "including," "having," and grammatical equivalents thereof are used herein to mean that other components, ingredients, operations, etc. are optionally present. For example, an article "comprising" (or "which comprises") components A, B, and C can consist of (i.e., contain only) components A, B, and C, or can contain not only components A, B, and C but also one or more other components.

Where reference is made herein to a method comprising two or more defined operations, the defined operations can be carried out in any order or simultaneously (except where the context excludes that possibility), and the method can include one or more other operations which are carried out before any of the defined operations, between two of the defined operations, or after all of the defined operations (except where the context excludes that possibility).

Scaling down of silicon metal oxide semiconductor (MOS) devices has become a major challenge in the semiconductor industry. One problem with the scaling of conventional planar devices is the short channel effects, which start to dominate over device performance. One solution for this problem came with the introduction of multi-gate devices with three-dimensional architecture, such as fin-based semiconductor devices or FINFETs and gate-all around (GAA) devices. Due to their three-dimensional architecture with either the gate being wrapped around a thin semiconductor fin for FINFET or the gate electrode surrounding all side surfaces of the channel region for GAA, improved gate control (and thus less short channel effects) over the channel could be achieved by using multiple gates.

Superlattice structures may be utilized in the fabrication of devices with three-dimensional architecture. These superlattice structures incorporate films, for example, stacks of alternating silicon (Si) layers and silicon germanium (SiGe) layers, which possess varying characteristics depending upon the particular application for which the film is being deposited. During the formation of some devices with three-dimensional architecture, silicon nanosheets are formed from the superlattice structure. These silicon nanosheets are formed by removing the SiGe layers from the superlattice structure by, for example, an etching process. However, after removal of the SiGe layers, the surface roughness of the silicon nanosheets is typically high. This varying surface roughness of the SiGe released silicon nanosheets provides additional roadblocks for subsequent processing.

Various embodiments described herein provide improved processes for treating SiGe released silicon nanosheets to enable surface roughness reduction (smoothing) created by the prior SiGe removal or etch processes. In some embodiments, the SiGe released silicon nanosheets are exposed to hydrogen radicals to reduce surface roughness of the silicon nanosheets. Treating the SiGe released silicon nanosheets with hydrogen radicals has been found by the inventors to not only reduce surface roughness (e.g., smoothing) of the silicon nanosheets but also reduce residual germanium remaining from the prior SiGe removal process. In addition, the hydrogen radical treatment described herein provides a high throughput treatment process tailored for the scenario seen on silicon nanosheet structures. Further, in some embodiments, the hydrogen radical treatment process is performed at low flow rates with mild hydrogen radical treatment without ion usage, which helps smooth surfaces of the silicon nanosheets for better process control. Additional benefits may include improved process control, precise SiGe removal, and/or elimination of an additional silicon re-deposition process.

FIG. 1A schematically illustrates an exemplary thermal processing system, processing chamber 100, which may be used to perform aspects of the methods described herein. Here, the processing chamber 100 features a chamber body 102 that defines a processing volume 104, a substrate support assembly 106 disposed in the processing volume 104, a remote plasma source (RPS) 108 fluidly coupled to the processing volume 104, and a system controller 110. The processing volume 104 is fluidly coupled to a vacuum source, such as to one or more dedicated vacuum pumps, which maintains the processing volume 104 at sub-atmospheric conditions and evacuates processing and other gases therefrom. The substrate support assembly 106 includes a substrate support 107 disposed on a support shaft 112 that sealingly extends through a base of the chamber body 102, such as being surrounded by a bellows (not shown) in a region above or below the chamber base. Herein, the substrate support 107 includes a heater 114, e.g., a resistive heating element, that is used to heat the substrate support 107, and thus a substrate 116 disposed on the substrate support 107, to a targeted processing temperature. In some embodiments, the substrate 116 is heated by lamps.

The RPS 108 is fluidly coupled to a hydrogen gas source 118 and is used to generate hydrogen radicals which are then flowed into the processing volume 104 through a conduit 120 fluidly coupled therebetween. In some embodiments, the conduit 120 features a dielectric liner 122, e.g., a quartz liner or an alumina liner, disposed therein. The dielectric liner 122 beneficially reduces the recombination of the radical species that might otherwise occur between the RPS 108 and the processing volume 104.

Generally, plasma excitation of the hydrogen gas to form neutral hydrogen radicals also forms charged hydrogen ions that may be accelerated towards the substrate 116 and cause undesirable damage to the features formed in the surface thereof. Thus, in some embodiments, the processing chamber 100 further includes an ion filter 124 disposed between the RPS 108 and the substrate support 107. The ion filter 124 is used to remove hydrogen ions from the effluent of the RPS 108. Examples of suitable ion filters that may be used with the processing chamber 100 include electrostatic filters, wire or mesh filters, plates with aspect ratio openings (e.g., >2:1), and magnetic ion filters. In embodiments herein, the ion filter 124 removes substantially all of the generated ion radicals from the RPS effluent before the effluent reaches the processing volume 104. As used herein, "substantially all of the generated hydrogen ions" means about 95% of the hydrogen ions generated by the RPS 108 or more.

The operation of the processing chamber 100 is facilitated by the system controller 110. The system controller 110 includes a programmable central processing unit, here the CPU 126, which is operable with a memory 128 (e.g., non-volatile memory) and support circuits 130. The CPU 126 is one of any form of general-purpose computer processors used in an industrial setting, such as a programmable logic controller (PLC), for controlling various chamber components and sub-processors. The memory 128, coupled to the CPU 126, is non-transitory and is in the form of a computer-readable storage medium containing instructions (e.g., non-volatile memory), that when executed by the CPU 126, facilitates the operation of the processing chamber. The support circuits 130 are conventionally coupled to the CPU 126 and include cache, clock circuits, input/output subsystems, power supplies, and the like, and combinations thereof coupled to the various components of the processing chamber 100, to facilitate control of substrate processing operations therewith.

Here, the instructions in the memory 128 are in the form of a program product such as a program that implements the methods, for example, portions of the method 300 and/or the method 500, of the present disclosure. In one example, the disclosure may be implemented as a program product stored on computer-readable storage media for use with a computer system. The program(s) of the program product defines functions of the embodiments (including the methods described herein). Thus, the computer-readable storage media, when carrying computer-readable instructions that direct the functions of the methods described herein, are embodiments of the present disclosure. In some embodiments, the processing chamber 100 may include any one or combination of the features of the processing system 150 described in FIG. 1B.

Figure 1B:
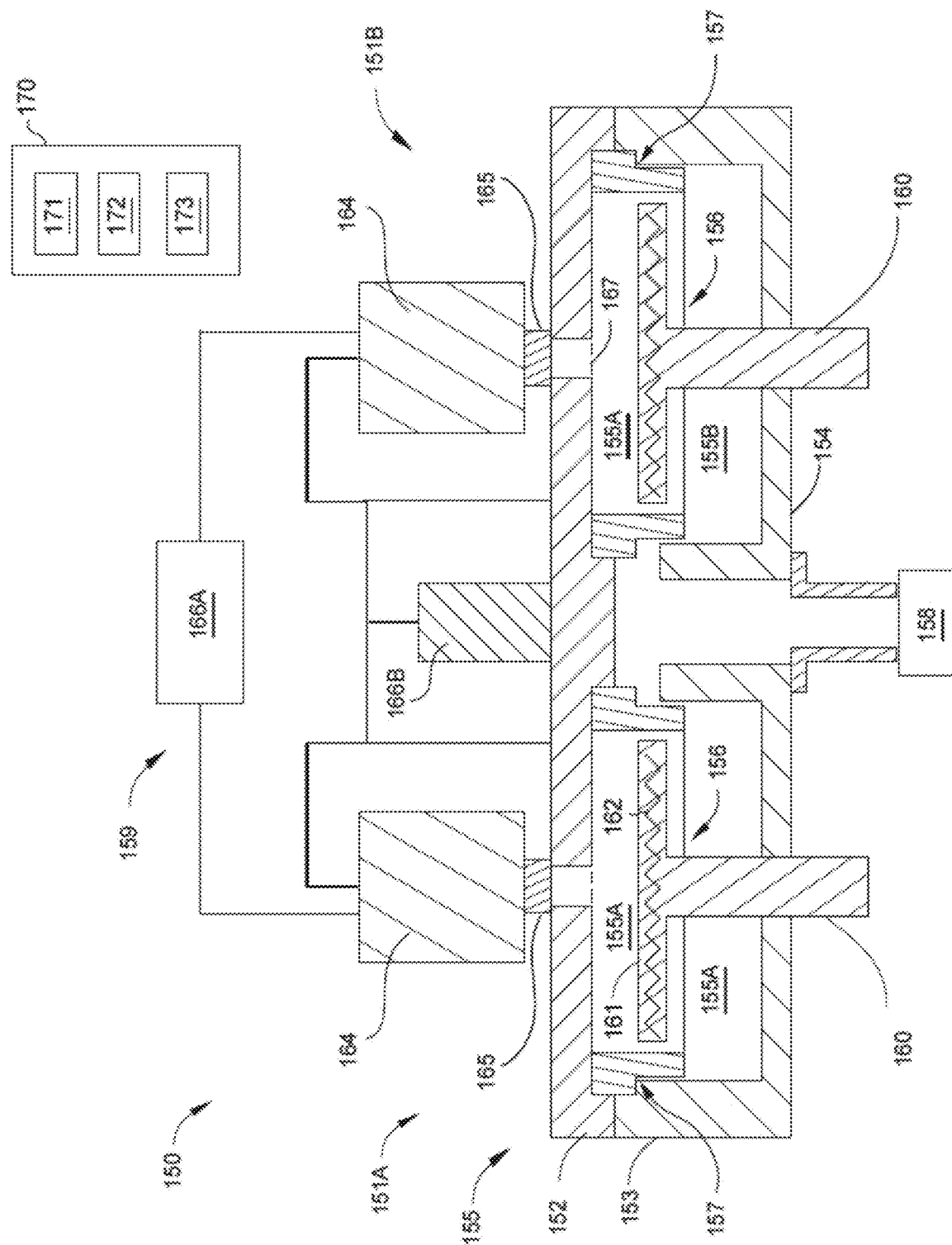

FIG. 1B is a schematic cross-sectional view illustrating a processing system 150, according to one embodiment, which may be used to perform the methods set forth herein. Here, the processing system 150 features tandem processing chambers 151A-B having a chamber lid 152, one or more chamber walls 153, and a chamber base 154 that collectively define a first chamber volume 155A and a second chamber volume 155B. Here, the configuration of each of the processing chambers 151A-B are substantially similar to one another to facilitate concurrent processing of a plurality of substrates (not shown) under the same or substantially similar process conditions. One or both of the processing chambers 151A-B may include any one or combination of the features of the processing chamber 100 described in FIG. 1A. In other embodiments, the configuration of the processing chambers 151A-B, e.g., one or more features and components thereof, are different from one another.

Each of the chamber volumes 155A-B has a respective substrate support assembly 156 disposed therein and a process kit 157 including one or more shields or liners used to shield processing components from the chamber volumes 155A-B and to direct the flow of gases therein. The chamber volumes 155A-B are fluidly coupled to a common vacuum source 158, such as one or more dedicated vacuum pumps, which are used to maintain the chamber volumes 155A-B at sub-atmospheric conditions and to evacuate processing and other gases therefrom. Processing gases are respectively delivered to the chamber volumes 155A-B using a common gas delivery system 159.

Here, each substrate support assembly 156 includes a support shaft 160 movably disposed through the chamber base 154, and a substrate support 161 disposed on the support shaft 160. Generally, the substrate support 161 includes a heater 162, such as a resistive heating element, used to heat and maintain a substrate at a targeted processing temperature. The chamber lid 152, the substrate supports 161, and shields and liners of the corresponding process kits 157 collectively define respective processing volumes 163A-B when the substrate supports 161 are in a raised position.

As shown, each of the processing volumes 163A-B is fluidly coupled to a respective remote plasma source (RPS) 164 using a gas conduit 165 disposed therebetween. Each RPS 164 is fluidly coupled to one or more gas sources 166A-B of the gas delivery system 159, which deliver processing and other gases thereto. In some embodiments, each of the gas conduits 165 includes a dielectric liner (not shown), such as the dielectric liner 122 described in FIG. 1A, and the processing system 150 further includes one or more ion filters 167 disposed between each RPS 164 and the substrate support 161 disposed in the processing volumes 163A-B. The ion filter 167 may be the same or substantially similar to the ion filter 124 described in FIG. 1A. In other embodiments, a single remote plasma source may be used to deliver activated species to each of the processing volumes 163A-B.

Operation of the processing system is facilitated by a system controller 170, which includes a CPU 171, memory 172, and support circuits 173, which are configured as described for the system controller 110 of FIG. 1A and include instructions in the memory 172 for implementing the methods described herein.

Figure 2:
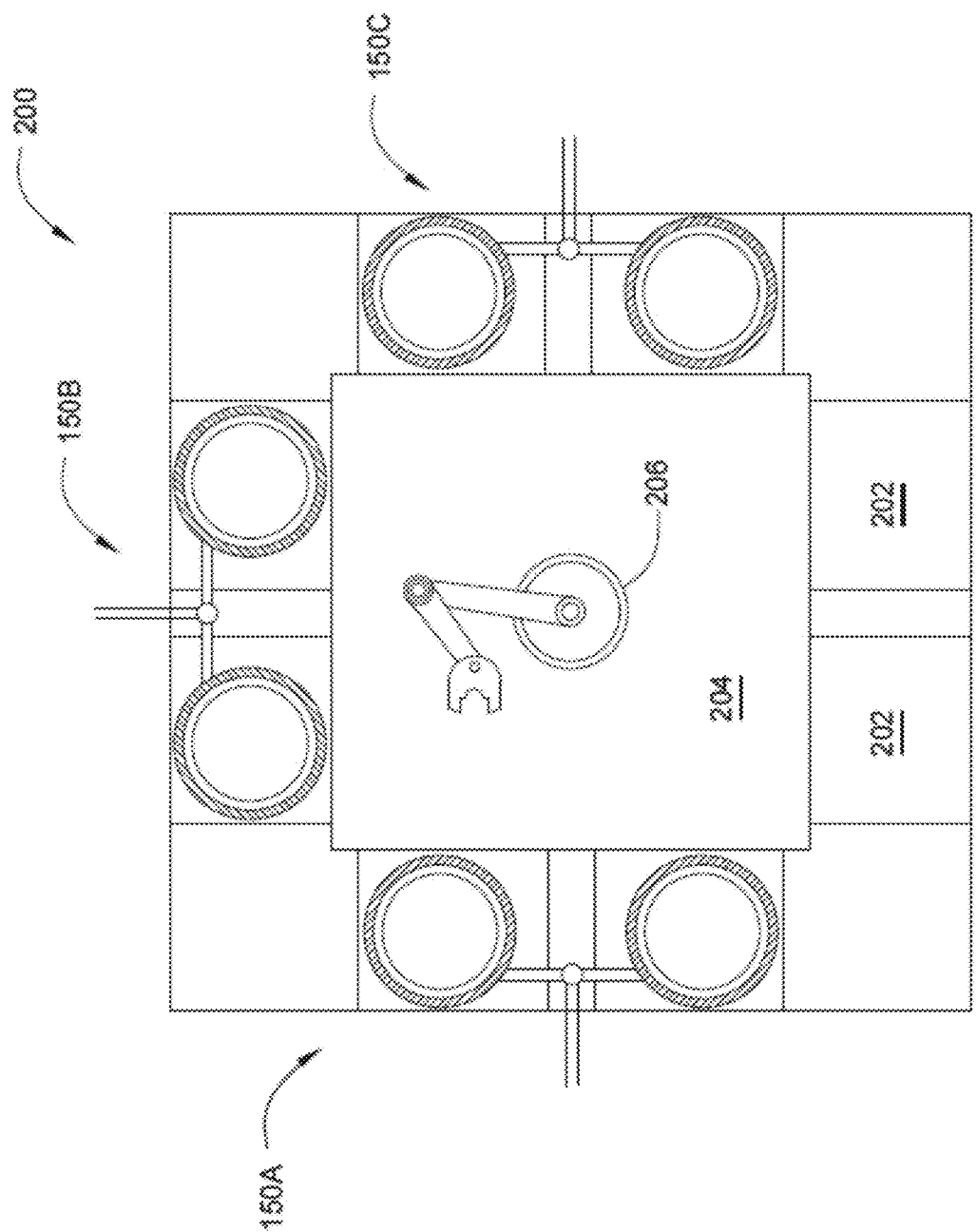
FIG. 2 illustrates a schematic plan view of a multi-chamber processing system that may be used to perform the methods set forth herein in accordance with one or more implementations of the present disclosure.

FIG. 2 is a top-down sectional view schematically illustrating a multi-chamber processing system 200, according to one embodiment, which may be used to perform the methods set forth herein. Here, the multi-chamber processing system 200 includes one or more load lock chambers 202 for receiving substrates into the multi-chamber processing system 200, a transfer chamber 204, and a plurality of processing systems 150A-C, here a first processing system 150A, a second processing system 150B, and an optional third processing system 150C. Each of the processing systems 150A-C are fluidly coupled to one another by the transfer chamber 204 disposed therebetween. The optional first processing system 150A may be an etch system configured to remove SiGe layers from a superlattice structure. The second processing system 150B is configured to perform the hydrogen radical treatment methods described herein and may be the same or substantially similar to the processing system 150 described in FIG. 1B. The optional third processing system 150C may include one or more thermal treatment chambers suitable for performing the thermal treatment process described herein. The transfer chamber 204 includes a substrate handler 206 to facilitate transfer substrates between the processing systems 150A-C. Here, the transfer chamber 204 is maintained under vacuum so that the substrate may be transferred between the processing systems 150A-C to perform various aspects of the methods set forth herein without exposing the substrate to atmospheric conditions.

Figure 3:
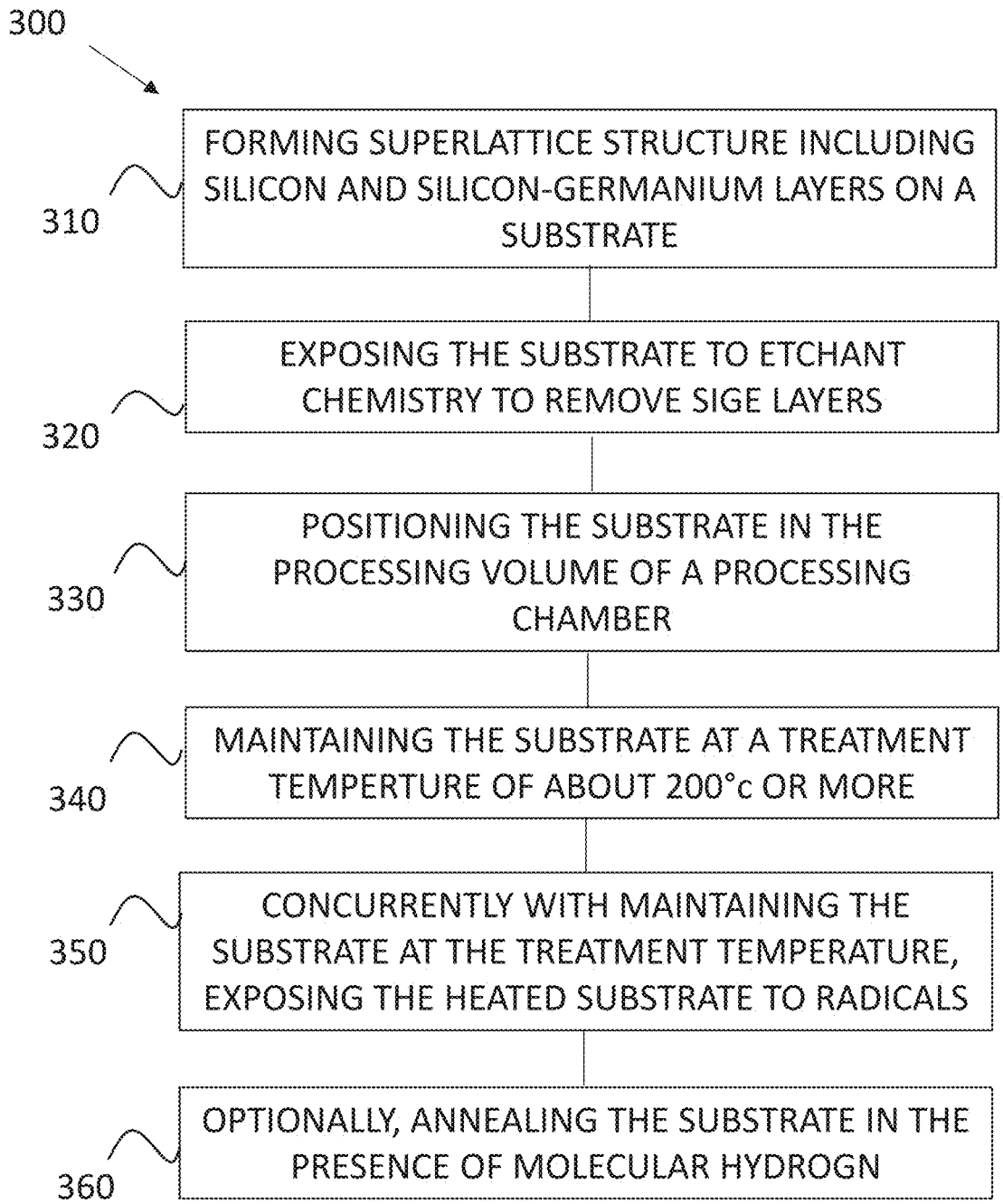
FIG. 3 illustrates an exemplary flow chart of a method in accordance with one or more implementations of the present disclosure.
Figure 4A:
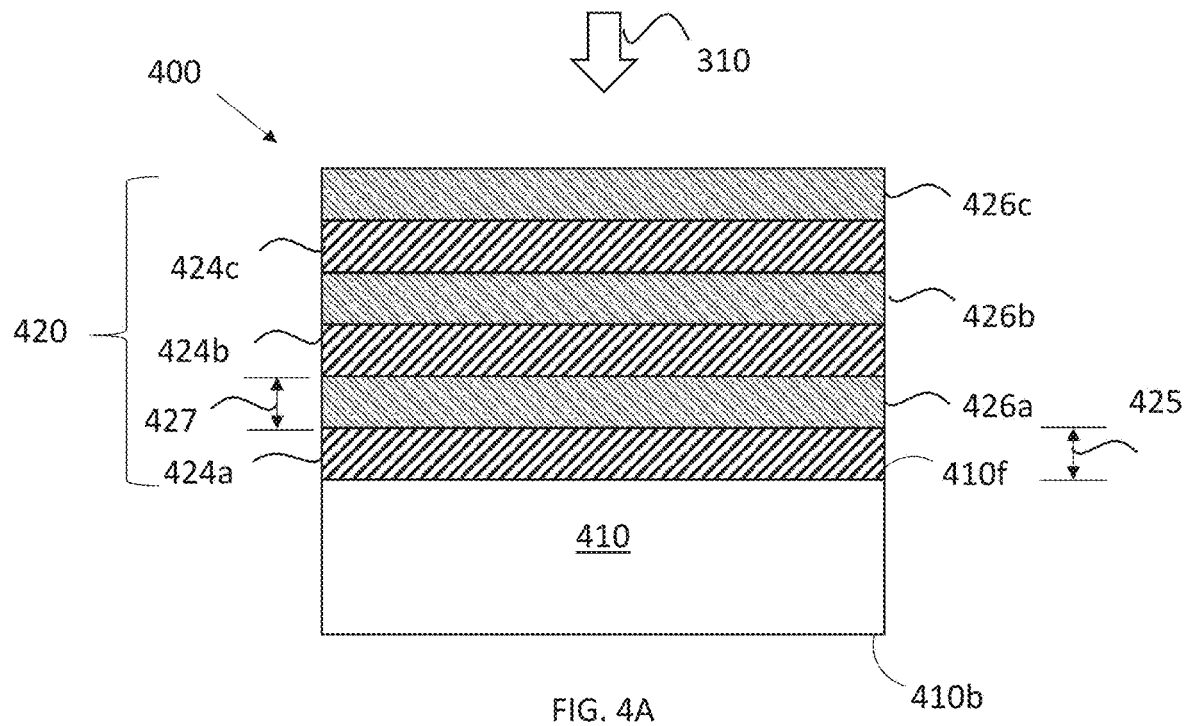
FIGS. 4A-4C illustrate cross-sectional views of various stages of manufacturing a superlattice structure in accordance with one or more implementations of the present disclosure.
Figure 4B:
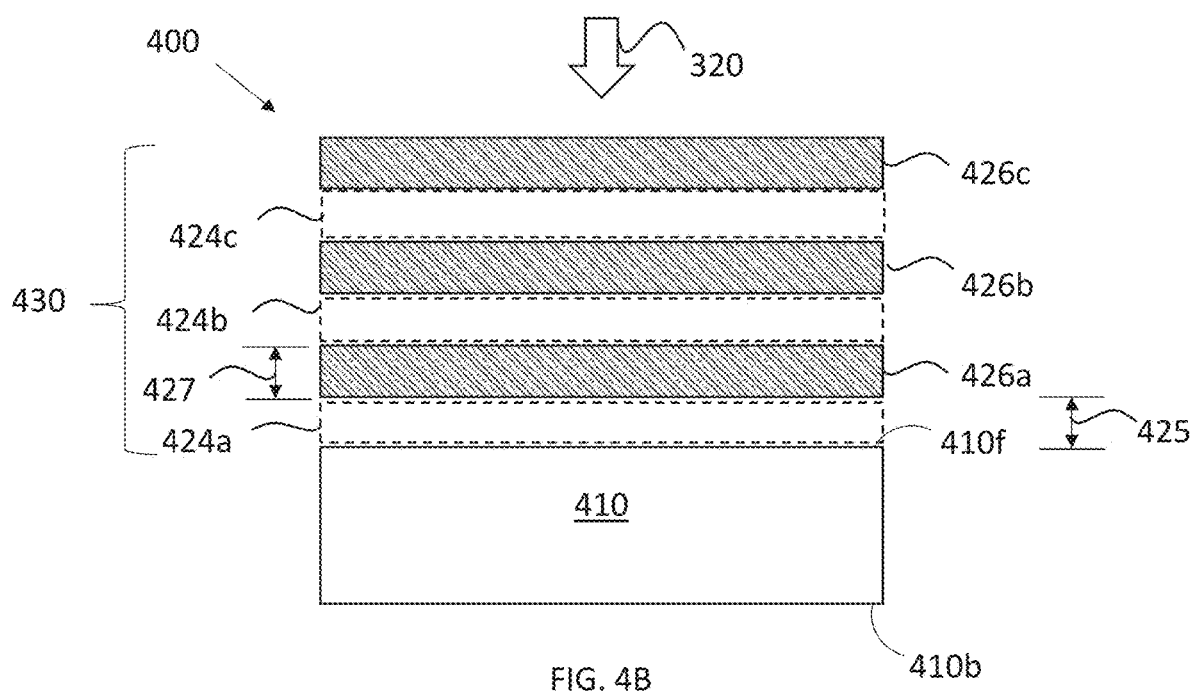
Figure 4C:
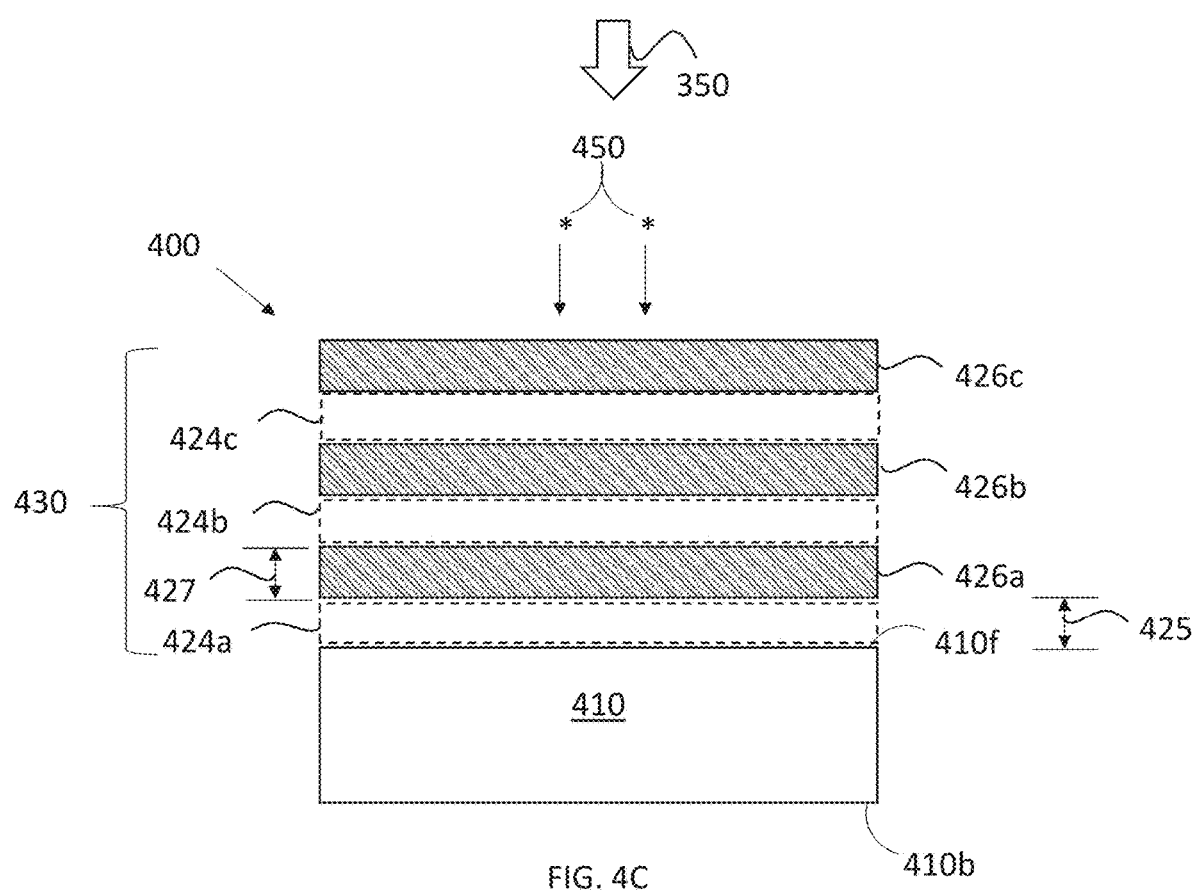

FIG. 3 illustrates an exemplary flow chart of a method 300 in accordance with one or more implementations of the present disclosure. FIGS. 4A-4C illustrate cross-sectional views of various stages of manufacturing a superlattice structure 420 in accordance with one or more implementations of the present disclosure. With reference to FIGS. 4A-4C, cross-sectional views of some embodiments of a device structure for semiconductor devices at various stages of manufacture are provided to illustrate the method of FIG. 3. Although FIGS. 4A-4C are described in relation to the method 300, it will be appreciated that the structure disclosed in FIGS. 4A-4C are not limited to the method 300 but instead may stand alone as structures independent of the method 300. Similarly, although the method 300 is described in relation to FIGS. 4A-4C, it will be appreciated that the method 300 is not limited to the structures disclosed in FIGS. 4A-4C but instead may stand alone independent of the structures disclosed in FIGS. 4A-4C.

FIG. 4A illustrates a cross-sectional view of a semiconductor device structure 400 during intermediate stages of manufacturing corresponding to operation 310 of the method 300, in accordance with some embodiments. The semiconductor device structure 400 includes a substrate 410. In some embodiments, the substrate 410 is a bulk semiconductor substrate. The term bulk semiconductor substrate refers to a substrate in which the entirety of the substrate is comprised of a semiconductor material. The bulk semiconductor substrate includes any suitable semiconducting material and/or combinations of semiconducting materials for forming a semiconductor structure. For example, the semiconducting layer may include one or more materials such as crystalline silicon (e.g., Si<100>, Si<110>, or Si<111>), silicon oxide, strained silicon, silicon germanium, doped or undoped polysilicon, doped or undoped silicon substrates, patterned or non-patterned substrates, doped silicon, germanium, gallium arsenide, or other suitable semiconducting materials. In some embodiments, the semiconductor material is silicon. In other embodiments, the semiconductor material is a doped material, such as n-doped silicon (n-Si), or p-doped silicon (p-Si). The substrate 410 has a frontside 410$f$ (also referred to as a front surface) and a backside 410$b$ (also referred to as a back surface) opposite the frontside 410$f$.

During operation 310, a superlattice structure 420 is formed over the frontside 410$f$ of the substrate 410. The superlattice structure 420 includes a plurality of first material layers 424$a$-$c$ and a corresponding plurality of second material layers 426$a$-$c$ alternatingly arranged in a plurality of stacked pairs. In one embodiment, the plurality of first material layers 424$a$-$c$ are formed from at least a silicon-containing material and a germanium-containing material. In one embodiment, the plurality of second material layers 426$a$-$c$ are formed from at least a silicon-containing material. Accordingly, the first material layers 424$a$-$c$ and the second material layers 426$a$-$c$ are different materials. In some embodiments, the plurality of first material layers 424 and corresponding plurality of second material layers 426 are lattice matched materials with a sufficient difference in composition such that selective layer removal or layer modification can subsequently be performed.

In some embodiments, the plurality of first material layers 424a-c and corresponding plurality of second material layers 426a-c may be any number of lattice matched material pairs suitable for forming the superlattice structure 420. For example, the plurality of first material layers 424a-c and corresponding plurality of second material layers 426a-c include between about 2 to about 5 pairs of lattice matched materials, for example, 3 pairs of lattice matched materials as is shown in FIG. 4B.

The material layers of the superlattice structure 420 may have controlled thicknesses to provide for substantially defect free crystallographic profiles of the various materials. In some embodiments, the layers of the superlattice structure 420 have a total thickness in a range from about 3 nm to about 50 nm, or in a range from about 5 nm to about 40 nm, or in a range from about 5 nm to about 30 nm, or in a range from about 5 nm to about 20 nm. In some embodiments, the layers of the superlattice structure 420 have a thickness in a range from about 3 nm to about 50 nm. For example, the plurality of first material layers 424a-c may have a thickness 425 in a range from about 1 nm to about 20 nm or, or in a range from about 1 nm to about 10 nm, or in a range from about 3 nm to about 10 nm, or in a range from about 5 nm to about 7 nm, for example, about 6 nm. The plurality of second material layers 426a-c may have a thickness 427 in a range from about 1 nm to about 20 nm, or in a range from about 5 nm and about 15 nm, or in a range from about 7 nm to about 10 nm, for example, about 8 nm.

In some embodiments, the superlattice structure 420 is formed via an epitaxial growth process. The epitaxial growth process may use CVD, MOCVD, MBE, LPE, VPE, UHCVD, or the like, or a combination thereof. The epitaxial growth process may take place in a first processing chamber.

During operation 320, a removal process for the first material layers 424a-c (e.g., SiGe layers) is performed to form a modified superlattice structure 430. After removal of the first material layers 424a-c (indicated with dashed lines in FIG. 4B), the second material layers 426a-c remain in the modified superlattice structure 430. In particular embodiments, in which the first material layers 424a-c are formed of silicon germanium (SiGe) and the second material layers 426a-c are formed of silicon (Si), the first material layers 424a-c may be removed, for example, by a removal process during operation 320. The removal process of operation 320 may be a wet etching process or a dry etching process. Any suitable etching process, which preferentially removes SiGe at a higher rate relative to silicon may be used. In some embodiments, the etching process is a dry etching process performed utilizing chlorine, bromine, or fluorine-based chemistry. In some embodiments, the removal process at operation 320 may use an etchant that etches the silicon germanium at a higher rate than the silicon, such as NH4OH:H2O2:H2O (ammonia peroxide mixture, APM), H2SO4+H2O2 (sulfuric acid peroxide mixture, SPM), or the like. Other suitable processes and materials may be used. This etching process removes the first material layers 424a-c. The etching process of operation 320 may be performed in a second processing chamber.

At operation 330, the method 300 includes positioning the substrate 410, having the modified superlattice structure 430 formed thereon as shown in FIG. 4B, in the processing volume of a processing chamber, for example, the processing volume 104 of the processing chamber 100 or the first chamber volume 155A of the processing system 150. Here, the processing volume is maintained under vacuum conditions, such as less than atmospheric pressure, such as less than about 500 Torr, less than about 400 Torr, less than about 300 Torr, less than about 200 Torr, less than about 100 Torr, or less than about 50 Torr. In some embodiments, the processing volume is maintained at a pressure in a range from about 10 mTorr to about 50 Torr, or in a range from about 1 Torr to about 10 Torr, or in a range from about 1 Torr to about 5 Torr.

At operation 340, the method 300 includes heating the substrate 410 to and maintaining the substrate 410 at a treatment temperature of about 200° C. or more, such as 250° C. or more, about 300° C. or more, about 350° C. or more, about 400° C. or more, or about 425° C. or more. In some embodiments, the thermal treatment temperature is in a range from about 200° C. to about 600° C., such as from about 250° C. to about 600° C., from about 250° C. to about 500° C., from about 250° C. to about 500° C., e.g., about 300° C., or from about 350° C. to about 550° C., such as from about 400° C. to about 500° C., e.g., about 450° C. In some embodiments, the treatment temperature is less than about 1000° C., such as less than about 900° C., less than about 800° C., less than about 700° C., or less than about 600° C. In particular embodiments, the thermal treatment temperature is in a range from about 450° C. to about 500° C. Not to be bound by theory, but in some embodiments, silicon etch rates decreased at temperatures of 450° C. and above, which promoted more smoothing of the silicon surface than roughening. However, at temperatures above 500° C. no additional benefit was found while risking possible thermal damage to the device.

At operation 350, the method 300 includes exposing the heated substrate 410 to hydrogen radicals 450. Here, the hydrogen radicals 450 are formed by flowing hydrogen gas ($H_2$) into a remote plasma source (RPS), for example, the RPS 108 or the RPS 164, fluidly coupled to the processing volume and igniting and maintaining a plasma of the hydrogen gas to form the hydrogen radicals 450 thereof. The hydrogen radicals 450 are then flowed into the processing volume, and the surfaces of the second material layers 426a-c (e.g., silicon layers) of the heated substrate 410 are exposed thereto. Typically, the flow rate of hydrogen gas ($H_2$) to the RPS for processing of a 300 mm diameter substrate is in a range from about 10 sccm to about 5000 sccm, or in a range from about 10 sccm to about 1500 sccm, or in a range from about 10 sccm to about 500 sccm, or in a range from about 10 sccm to about 100 sccm, or in a range from about 50 sccm to about 100 sccm. Not to be bound by theory but in some embodiments, higher radical flux caused by for example, hydrogen flow rates greater than 500 sccm bombard the silicon surface causing more damage than smoothing. Appropriate scaling may be used for different-sized substrates. In other embodiments, a remote plasma may be formed in a portion of a processing volume of a processing chamber that is separated from the portion of the processing volume having the substrate disposed therein. For example, in those embodiments, the remote plasma may be formed in a portion of a processing volume that is separated from the substrate processing portion by a showerhead.

Typically, the effluent from the RPS is flowed through an ion filter, for example, the ion filter 124 or the ion filter 167, to remove substantially all ions therefrom before the hydrogen radicals reach the processing volume and the surface of the substrate disposed therein. In embodiments where the remote plasma is formed in a separate portion of the processing volume, a showerhead disposed between the remote plasma and the substrate processing portion may be used as the ion filter.

In one embodiment, operations 340 and 350 include heating and maintaining a substrate having silicon nanosheets formed thereon to a temperature in a range from about 450 degrees Celsius to about 500 degrees Celsius, maintaining the processing volume at pressure in a range from about 1 Torr to about 5 Torr, for example, about 2 Torr, exposing the substrate to hydrogen radicals for a period of 1 to 5 minutes, where the hydrogen radicals are formed in an RPS by flowing hydrogen gas to the RPS at a flow rate from about 50 sccm to about 100 sccm, for example, about 100 sccm.

Here, the operation 340 and the operation 350 are performed concurrently so the substrate is maintained at the targeted treatment temperature, and the second material layers 426a-c (e.g., silicon layers) disposed thereon are concurrently exposed to the hydrogen radicals 450 for a targeted treatment time. In some embodiments, the treatment time, here the amount of time the substrate 410 is maintained at the treatment temperature while the second material layers 426a-c (e.g., silicon layers) are concurrently exposed to hydrogen radicals from the RPS, is about 20 seconds or more, such as about 30 seconds or more, about 40 seconds or more, about 50 seconds or more, about 1 minute or more, about 1.5 minutes or more, about 2 minutes or more, about 2.5 minutes or more, about 3 minutes or more, about 3.5 minutes or more, about 4 minutes or more, about 4.5 minutes or more, e.g., about 5 minutes or more, or in a range from about 1 minute to about 5 minutes.

In other embodiments, the hydrogen radical treatment process of operation 350 is replaced by a thermal treatment process. The thermal treatment process includes heating and maintaining the substrate disposed in a processing region at a treatment temperature as described in operation 340. During the thermal treatment process, the processing volume is maintained under vacuum conditions, such as less than atmospheric pressure, for example, less than about 700 Torr, less than about 600 Torr, less than about 500 Torr, less than about 400 Torr, less than about 300 Torr, or less than about 200 Torr. In some embodiments, the processing volume is maintained at a pressure in a range from about 300 Torr to about 700 Torr, or in a range from about 400 Torr to about 600 Torr, or in a range from about 500 Torr to about 530 Torr. During the thermal treatment process, the hydrogen gas (e.g., H2) may be flowed at about the same flow rate as during the hydrogen radical treatment of operation 350 or may be increased or decreased relative thereto. The hydrogen gas may be introduced into the processing region with an inert gas. In one embodiment, treatment gas mixture includes hydrogen in a range from about 0.1% to about 100% with the remainder being an inert carrier gas such as argon, helium, or xenon. In one example, the treatment gas mixture includes hydrogen gas in a range from about 90% to about 100% for example, 100% hydrogen. In some embodiments, the treatment time, here the amount of time the substrate 410 is maintained at the thermal treatment temperature while the second material layers 426a-c (e.g., silicon layers) are concurrently exposed to the thermal treatment process, is about 20 seconds or more, such as about 30 seconds or more, about 40 seconds or more, about 50 seconds or more, about 1 minute or more, about 1.5 minutes or more, about 2 minutes or more, about 2.5 minutes or more, about 3 minutes or more, about 3.5 minutes or more, about 4 minutes or more, about 4.5 minutes or more, e.g., about 5 minutes or more.

In one embodiment, the thermal treatment process includes heating and maintaining a substrate having silicon nanosheets formed thereon to a temperature in a range from about 450 degrees Celsius to about 500 degrees Celsius, maintaining the processing volume at pressure in a range from about 500 Torr to about 600 Torr, for example, about 530 Torr, exposing the substrate to the thermal treatment process for a period of 1 to 5 minutes, where the treatment gas mixture includes from 95 to 100% hydrogen, for example, 100% hydrogen.

In other embodiments, both the hydrogen radical treatment process of operation 350 and the thermal treatment process are performed. For example, the thermal treatment process may be performed either before, after, or both before and after the hydrogen radical treatment process of operation 350.

At operation 360, the method 300 optionally includes a thermal bake process including maintaining the substrate at or near the treatment temperature in the presence of hydrogen gas. Here, the thermal bake process includes maintaining the substrate 410 at the treatment temperature or heating the substrate 410 to a second temperature that is different than the treatment temperature while concurrently flowing hydrogen gas into the processing volume. Typically, flowing hydrogen gas into the processing volume includes extinguishing the plasma formed in the RPS while continuing to flow hydrogen gas there into. At operation 360, the hydrogen gas may be flowed at about the same flow rate as during the hydrogen radical treatment operations 340 and 350 or may be increased or decreased relative thereto. Operation 360 of the method 300 may be performed in the same processing chamber as operation 340 and operation 350. In other embodiments, the substrate 410 may be transferred under vacuum to a second processing chamber of a multi-chamber processing system, and the thermal bake process may be performed in the second processing chamber. In some embodiments, the second temperature at operation 360 is about 1.10× or greater than the treatment temperature at operation 340 and operation 350, such as about 1.2× or greater, about 1.3× or greater, about 1.4× or greater, about 1.5× or greater, about 1.6× or greater, about 1.7× or greater, about 1.8× or greater, about 1.9× or greater, or about 2× or greater. In other embodiments, the second temperature is about 1.1× or less than the treatment temperature at operation 340 and operation 350, such as about 1.2× or less, about 1.3× or less, about 1.4× or less, about 1.5× or less, about 1.6× or less, about 1.7× or less, about 1.8× or less, about 1.9× or less, or about 2× or less.

Figure 5:
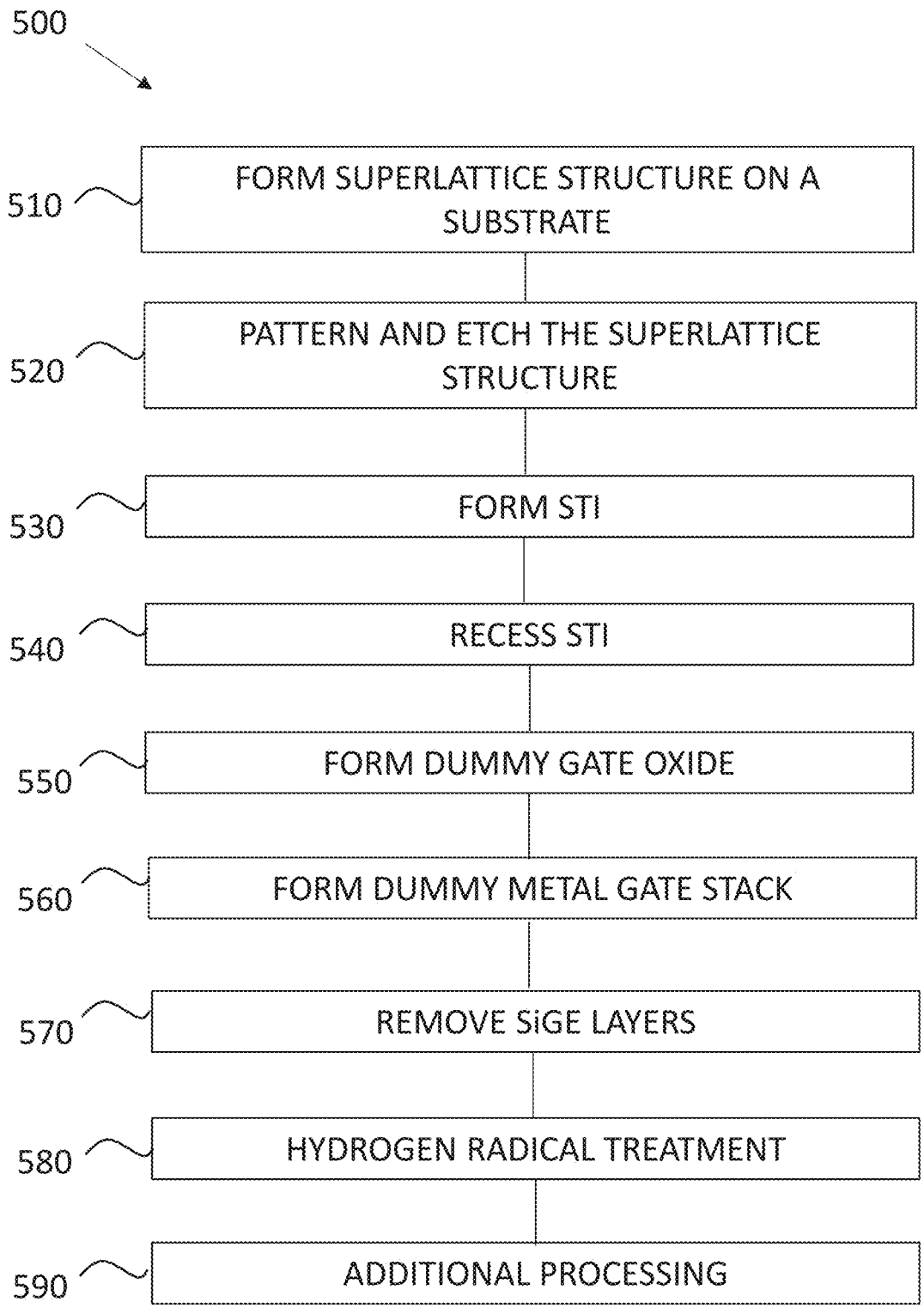
FIG. 5 illustrates a flow chart of a method for manufacturing a transistor device structure incorporating a superlattice structure in accordance with one or more implementations of the present disclosure.

FIG. 5 illustrates a flow chart of a method 500 for manufacturing a transistor device incorporating a superlattice structure in accordance with one or more implementations of the present disclosure. FIGS. 6A-6F illustrate cross-sectional views of various stages of manufacturing a transistor device incorporating a superlattice structure in accordance with one or more embodiments of the present disclosure. The transistor device may be a GAA device. Although FIGS. 6A-6F are described in relation to the method 500, it will be appreciated that the structure disclosed in FIGS. 6A-6F is not limited to the method 500 but instead may stand alone as structures independent of the method 500. Similarly, although the method 500 is described in relation to FIGS. 6A-6F, it will be appreciated that the method 500 is not limited to the structures disclosed in FIGS. 6A-6F but instead may stand alone independent of the structures disclosed in FIGS. 6A-6F.

At operation 510 of the method 500, a superlattice structure is formed on a substrate, for example, the superlattice structure 420 formed on the substrate 410 as shown in FIG. 4A.

Figure 6A:
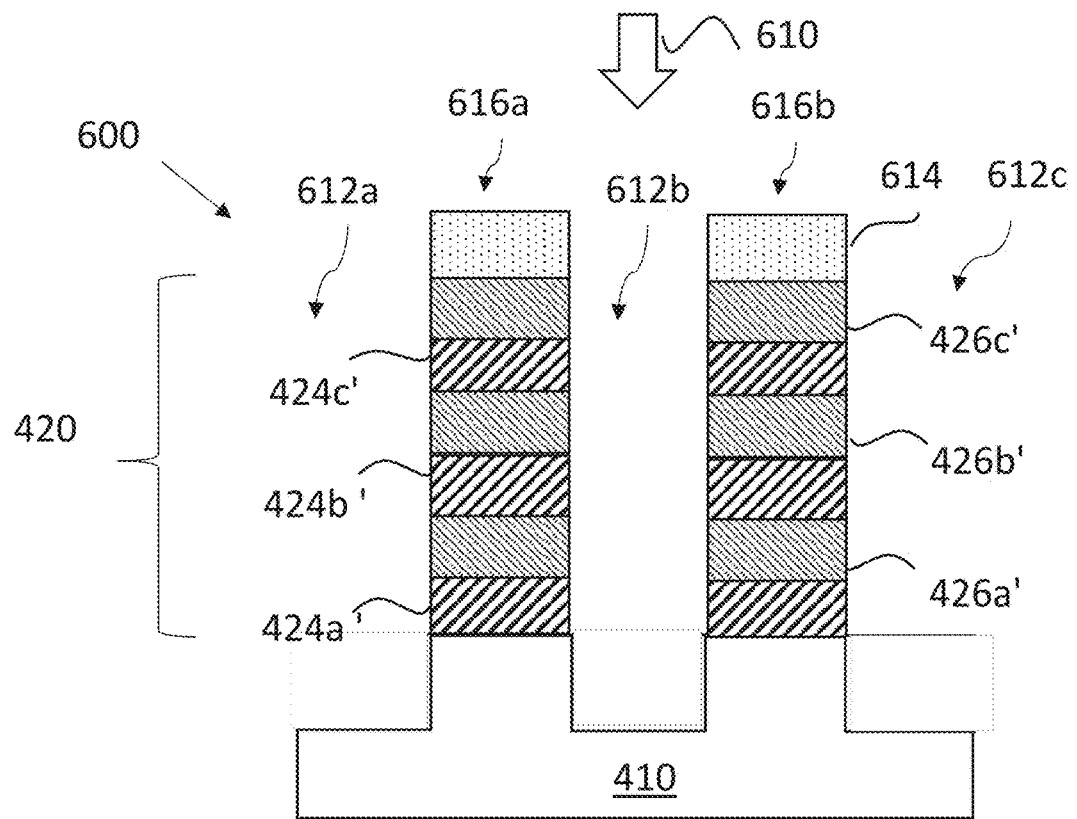
FIGS. 6A-6F illustrate cross-sectional views of various stages of manufacturing a transistor device structure incorporating a superlattice structure in accordance with one or more implementations of the present disclosure.

FIG. 6A illustrates a cross-sectional view of a portion of the semiconductor device structure 600 during intermediate stages of manufacturing corresponding to operation 520, in accordance with some embodiments. At operation 520, a patterning and etching process 610 is performed to form trenches 612a-c in the superlattice structure 420, after a hardmask layer 614 is deposited on the top surface of the superlattice structure 420. In some embodiments, photolithography techniques are utilized to pattern the hardmask layer 614. Generally, a photoresist material (not shown) is deposited over the hardmask layer 614. The photoresist material is irradiated (exposed) with radiation, for example, light, through a patterned reticle in order to induce a reaction in the portions of the photoresist material exposed to the energy. The photoresist material is developed to remove a portion of the photoresist material, wherein the remaining photoresist material protects the underlying material from subsequent processing operations, such as etching.

As shown in FIG. 6A, after the etching process is performed to the superlattice structure 420, remaining regions of the superlattice structure 420 and the underlying substrate 410 form fins, such as a first fin 616a and a second fin 616b (collectively referred to as fins 616). As can be seen in FIG. 6A, the fins 616 include portions of the superlattice structure 420 (e.g., portions of the first material layers 424' (e.g., SiGe layers) and portions of the second material layers 426' (e.g., silicon layers)), and portions of the substrate 410. Although two fins, the first fin 616a and the second fin 616b, are shown in FIG. 6A, it is to be understood that any suitable number and type of fins may be utilized.

Figure 6B:
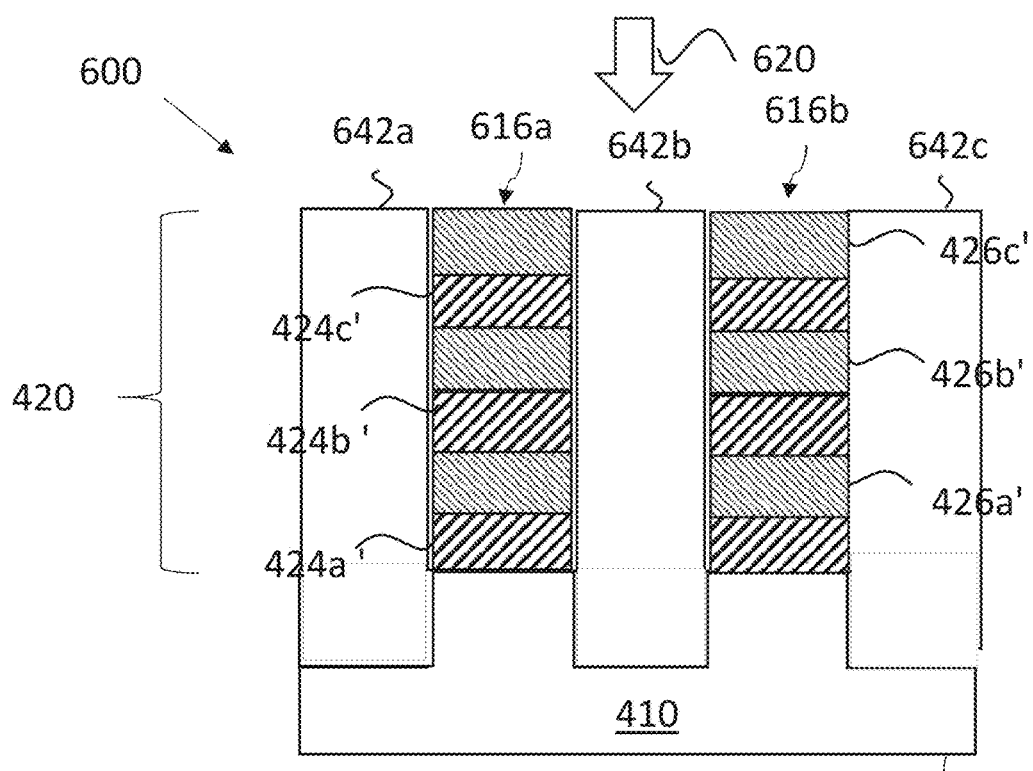

FIG. 6B illustrates a cross-sectional view of a portion of the semiconductor device structure 600 during intermediate stages of manufacturing corresponding to operation 530, in accordance with some embodiments. At operation 530, shallow trench isolations (STIs) 622a-c are formed, in accordance with some embodiments. At operation 530 a deposition process 620 may be performed to deposit a dielectric insulating material in the trenches 612a-c between adjacent fins 616 to form STIs 622a-c. The STIs 622a-c may be made of suitable dielectric materials such as silicon oxide, silicon nitride, silicon oxynitride, fluoride-doped silicate glass (FSG), low-k dielectrics such as carbon doped oxides, extremely low-k dielectrics such as porous carbon doped silicon dioxide, a polymer such as polyimide, combinations thereof, or the like. In some embodiments, the deposition process 620 is a process such as CVD, flowable CVD (FCVD), or a spin-on-glass process, although any acceptable process may be utilized. Subsequently, the STIs 622a-c may be subject to one or more of a hardmask removal process and a process for removal of portions of the STIs 622a-c extending over the top surfaces of the fins 616a-b using, for example, an etch process, chemical mechanical polishing (CMP), or the like.

Figure 6C:
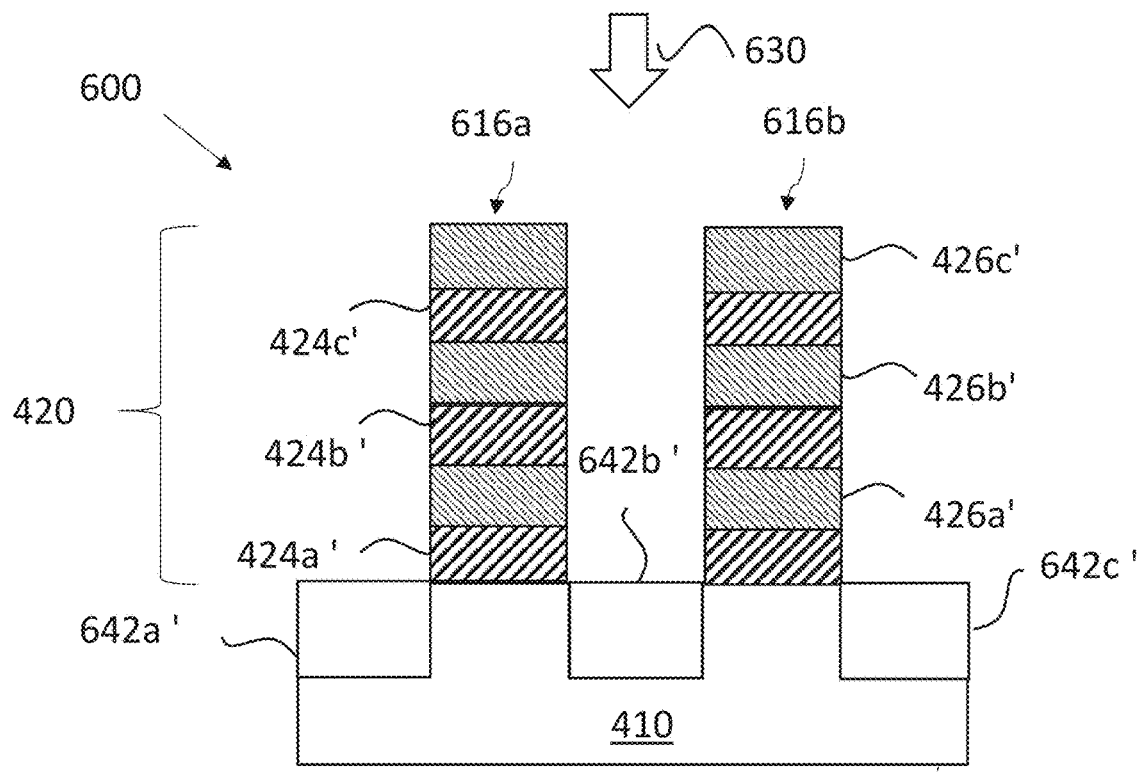

FIG. 6C illustrates a cross-sectional view of a portion of the semiconductor device structure 600 during intermediate stages of manufacturing corresponding to operation 540, in accordance with some embodiments. At operation 540, the sidewalls of the fins 616a-b may be exposed by recessing of the STIs 622a-c to form recessed STIs 622a'-c'. In some embodiments, the STIs 622a-c are recessed using one or more selective etch processes 630 utilizing the fins 616a-b as an etch mask. For example, the STIs 622a-c are recessed using one or more etching processes. A depth of the recessed STIs 622a'-c' may be determined by a height of the superlattice structure 420. In some embodiments, the recess extends to a depth such that the bottom-most first material layer 424a' is exposed. Alternatively, a bottom-most first material layer 424a' (e.g., SiGe layer) may remain below the upper surface of the recessed STIs 622a'-c'.

Figure 6D:
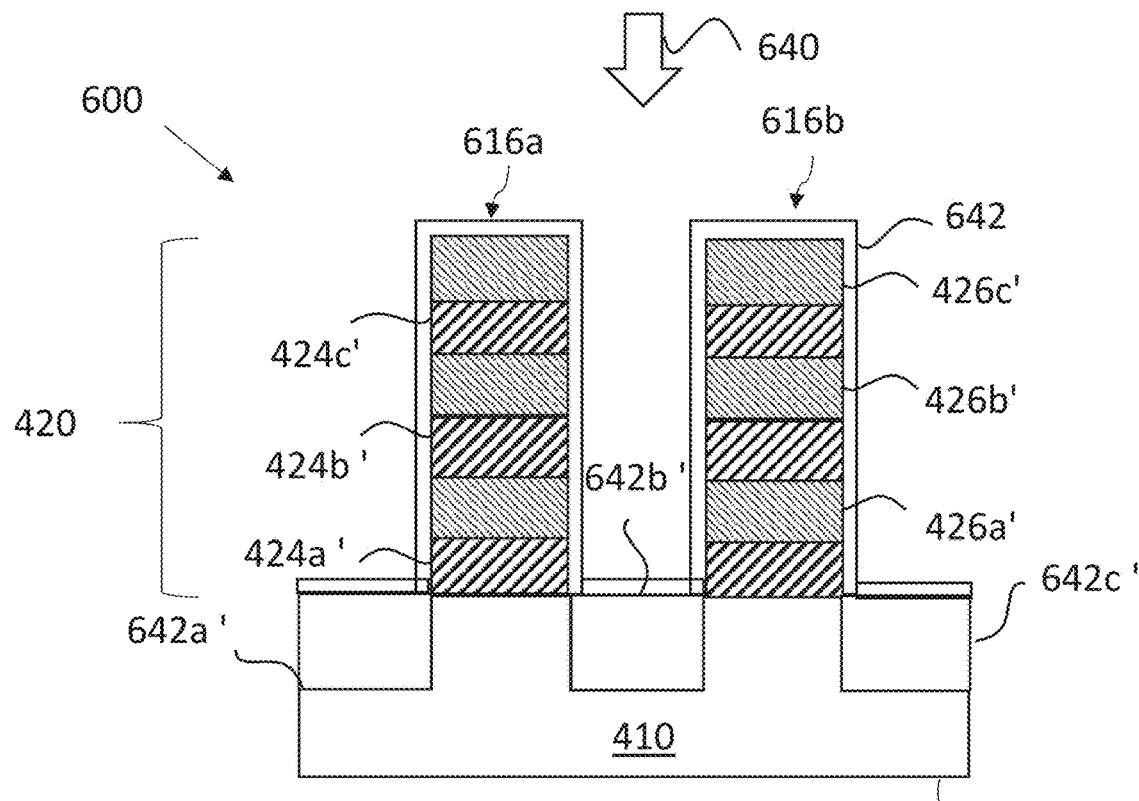

FIG. 6D illustrates a cross-sectional view of a portion of the semiconductor device structure 600 during intermediate stages of manufacturing corresponding to operation 550, in accordance with some embodiments. At operation 550, a dummy gate oxide layer 642 is formed over the exposed fins 616a-b. In some embodiments, the dummy gate oxide layer 642 may be formed by a deposition process 640, for example, thermal oxidation, CVD, sputtering, or any other methods known and used in the art for forming a dummy gate oxide layer 642. In some embodiments, the dummy gate oxide layer 642 may be formed of the same material as the STIs 622a-c. In other embodiments, the dummy gate oxide layer 642 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or a combination thereof. In other embodiments, the dummy gate oxide layer 642 includes dielectric materials having a high dielectric constant (k-value), for example, greater than 3.9. The materials may include silicon nitrides, oxynitrides, metal oxides such as HfO2, HfZrOx, HfSiOx, HfTiOx, HfAlOx, a combination thereof, multi-layers thereof, or the like.

Figure 6E:
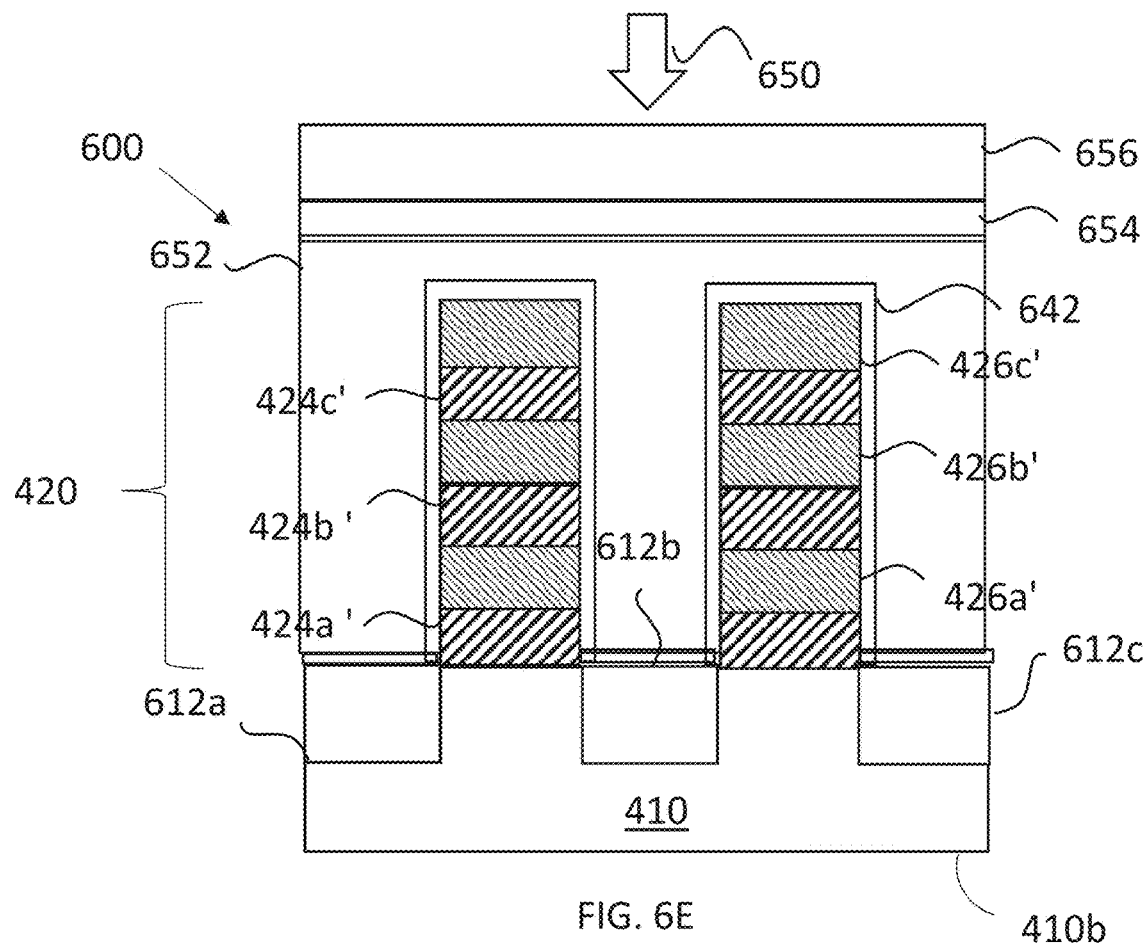

FIG. 6E illustrates a view of a portion of the semiconductor device structure 600 during intermediate stages of manufacturing corresponding to operation 560, in accordance with some embodiments. At operation 560, a dummy metal layer 652 may be deposited over the dummy gate oxide layer 642 (shown in FIG. 6D). In an embodiment, the dummy metal layer 652 is a conductive material and may be selected from a group including polycrystalline-silicon (poly-Si), poly-crystalline silicon-germanium (poly-SiGe), metallic nitrides, metallic silicides, metallic oxides, and metals. In an embodiment, the dummy metal layer 652 may be deposited by a deposition process 650, for example, PVD, CVD, sputter deposition, or other techniques known and used in the art for depositing conductive materials. Other materials, conductive and non-conductive, may be used. The top surface of the dummy metal layer 652 may be planarized after it is deposited.

In some embodiments, a first hardmask layer 654 is deposited over the dummy metal layer 652 through a deposition process such as CVD, or a spin-on-glass process, although any acceptable process may be utilized. In particular embodiments, the first hardmask layer 654 may be an oxide layer (e.g., silicon oxide) and may have a thickness in a range from about 10 Å to about 50 Å. A second hardmask layer 656 may then be deposited on the first hardmask layer 654 through a process such as CVD, or a spin-on-glass process, although any acceptable process may be utilized. In particular embodiments, the second hardmask layer 656 may be a nitride (e.g., silicon nitride). The second hardmask layer 656 may have a thickness from about 150 Å to about 850 Å. The first hardmask layer 654 and the second hardmask layer 656 may be patterned to form a dummy gate hardmask layer stack (not shown) over the dummy metal layer 652. In particular embodiments, a polysilicon etch and a dummy oxide removal process are performed using the dummy gate hardmask layer stack to pattern the dummy metal layer 652 and the dummy gate oxide layer 642. During patterning, portions of the dummy metal layer 652 and portions of the dummy gate oxide layer 642 are removed from source/drain areas of the fins 616a-b and portions of the dummy metal layer 652 and portions of the dummy gate oxide layer 642 remain over a channel region of the fins 616a-b to form a dummy metal gate electrode (not shown). The dummy metal gate electrode may include the patterned dummy metal layer and the patterned dummy gate oxide layer disposed below the patterned dummy metal layer. The dummy metal gate electrode and the dummy gate hardmask layer stack collectively form a dummy metal gate stack (not shown).

The dummy metal gate stack may then be used to define and form source/drain regions from the exposed portions of fins 616a-b. The dummy metal gate stack may then be removed to allow processing to be performed to define and form channel regions from the center portions of fins 616a-b (not shown).

Figure 6F:
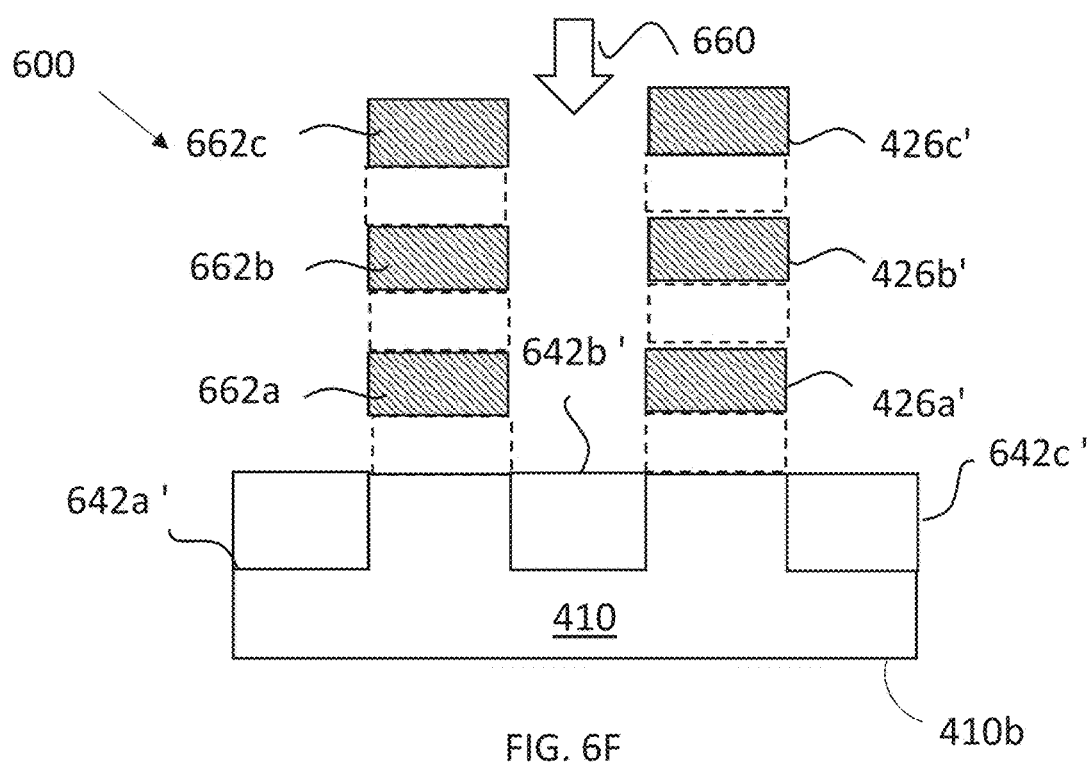

FIG. 6F illustrates a cross-sectional view of a portion of the semiconductor device structure 600 during intermediate stages of manufacturing corresponding to operation 570, in accordance with some embodiments. At operation 570, a removal process for the first material layers 424a-c (e.g., SiGe layers) is performed. After removal of the first material layers 424a-c (indicated with dashed lines in FIG. 6F), the second material layers 426a-c remain in the fins 616a-b. In particular embodiments, in which the first material layers 424a-c are formed of silicon germanium (SiGe) and the second material layers 426a-c are formed of silicon (Si), the first material layers 424a-c may be removed, for example, by a removal process 660. The removal process 660 may be a wet etching process or a dry etching process. Any suitable etching process, which preferentially removes SiGe at a higher rate relative to silicon may be used. In some embodiments, the etching process is a dry etching process performed utilizing chlorine, bromine, or fluorine based chemistry. In some embodiments, the removal process 660 may use an etchant that etches the silicon germanium at a higher rate than the silicon, such as NH4OH:H2O2:H2O (ammonia peroxide mixture, APM), H2SO4+H2O2 (sulfuric acid peroxide mixture, SPM), or the like. Other suitable processes and materials may be used. This etching process removes the first material layers 424a-c. Thus, first nanowires 662a-c or nanosheets are formed from fins 616a-b for an n-type device. In some embodiments, after etching, a bottom-most first layer 424a (e.g., SiGe layer) may remain below the upper surface of the recessed STIs 622a'-c' as a stress layer within the first fin 616a and the second fin 616b to provide certain strains or relaxations of the fin materials.

After operation 580, the semiconductor device structure 600 is subjected to a hydrogen radical treatment process as described with respect to operations 330-360 of FIG. 3 to smooth the exposed surfaces of the second material layers 426a-c (e.g., silicon material layers).

After operation 590, the semiconductor device structure 600 may be subjected to additional processing at operation 580 to form the final device structure, for example, a GAA device.

Beneficially, the hydrogen radical treatment methods provided herein, provide for smoothing of the surfaces of silicon nanosheets after removal of SiGe layers. This reduction in roughness provides for better process control, precise SiGe removal, and elimination of an additional silicon deposition repair process to reduce surface roughness.

EXAMPLES

The following non-limiting examples are provided to further illustrate embodiments described herein. However, the examples are not intended to be all inclusive and are not intended to limit the scope of the embodiments described herein.

Figure 7:
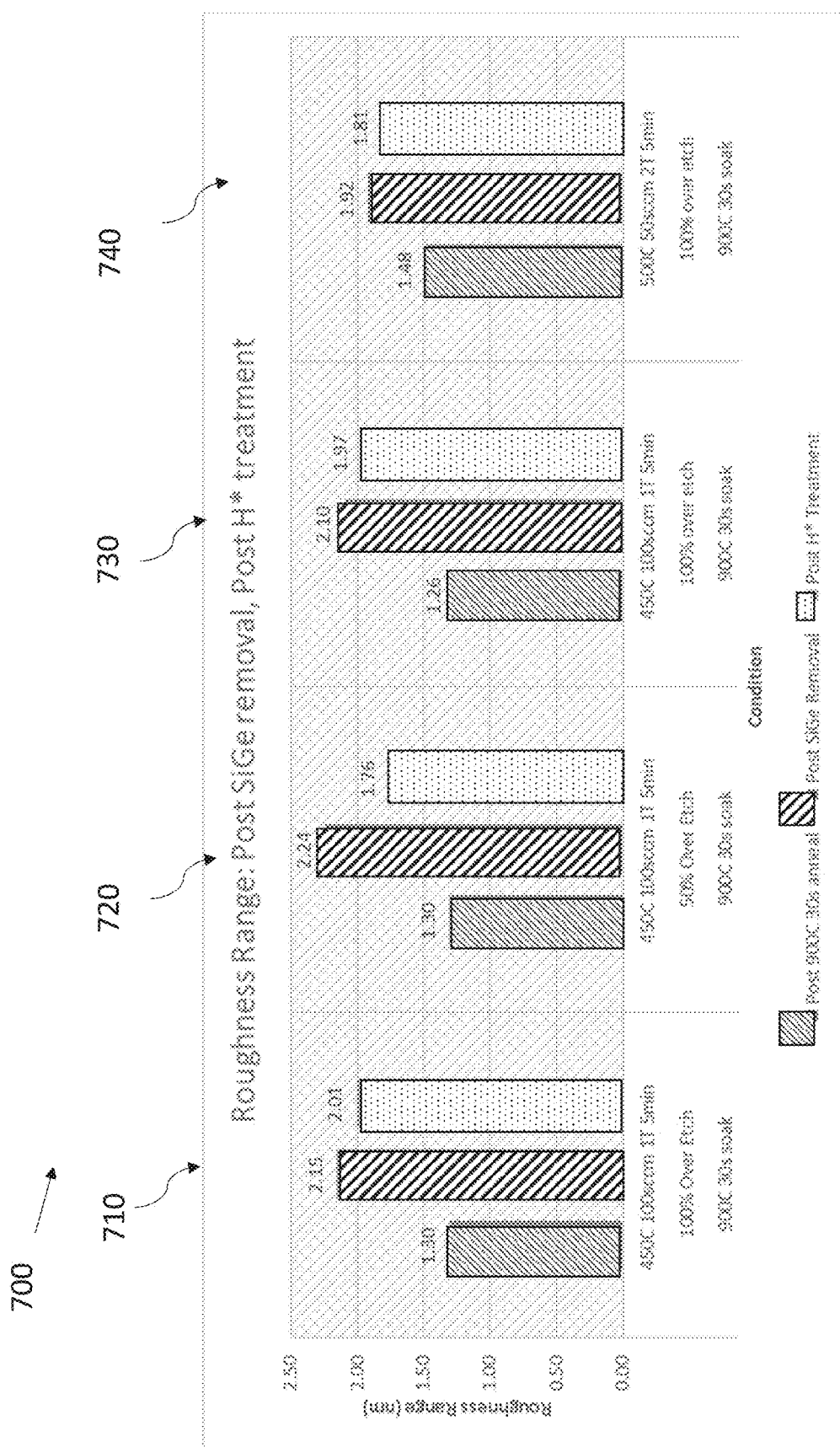
FIG. 7 illustrates a bar graph demonstrating surface roughness of a silicon surface before and after the treatment methods described herein.

FIG. 7 illustrates a bar graph having portions 710, 720, 730, and 740 showing surface roughness of a silicon surface before and after the treatment methods described herein. The results were obtained using atomic-force microscopy (AFM) to analyze the silicon surfaces. The roughness range in nanometers is the peak to valley of the AFM scan, for example, the difference between maximum and minimum.

Silicon wafers having an eight nanometer thick 20% germanium containing SiGe layer formed thereon were provided. The wafers were exposed to a 900 degrees Celsius soak process for 30 seconds to simulate thermal budget and intermixing. The SiGe layer was then removed via etch chemistry followed by a hydrogen radical treatment process as described herein.

All wafers represented by portions 710, 720, 730, and 740 were exposed to a 900 degrees Celsius soak process for 30 seconds. The soak process is used to mimic thermal budget in the real device. The wafer represented by portion 710 was exposed to a 100% over-etch followed by a hydrogen radical treatment process at 450 degrees Celsius, with a flow rate of H2 of 100 sccm, the processing region is maintained at a pressure of 1 Torr, for an exposure period of 5 minutes. Referring to portion 710 of the bar graph 700, after the soak process, the wafer exhibited a surface roughness of about 1.30 nm. After the over-etch process to remove SiGe, the surface roughness of the wafer increased to about 2.15 nm. After exposure to the hydrogen radical process the surface roughness of the wafer decreased by about 7% to about 2.01 nm.

The wafer represented by portion 720 was exposed to a 50% over-etch followed by a hydrogen radical treatment process at 450 degrees Celsius, with a flow rate of H2 of 100 sccm, the processing region is maintained at a pressure of 1 Torr, for an exposure period of 5 minutes. Referring to portion 720 of the bar graph 700, after the soak process, the wafer exhibited a surface roughness of about 1.30 nm. After the over-etch process to remove SiGe, the surface roughness of the wafer increased to about 2.24 nm. After exposure to the hydrogen radical process the surface roughness of the wafer decreased by about 21% to about 1.76 nm.

The wafer represented by portion 740 was exposed to a 100% over-etch followed by a hydrogen radical treatment process at 500 degrees Celsius, with a flow rate of H2 of 50 sccm, the processing region is maintained at a pressure of 2 Torr, for an exposure period of 5 minutes. Referring to portion 740 of the bar graph 700, after the soak process, the wafer exhibited a surface roughness of about 1.48 nm. After the over-etch process to remove SiGe, the surface roughness of the wafer increased to about 1.92 nm. After exposure to the hydrogen radical process the surface roughness of the wafer decreased by about 6% to about 1.81 nm.

The wafer represented by portion 730 was exposed to a 100% over-etch followed by a hydrogen radical treatment process at 450 degrees Celsius, with a flow rate of H2 of 100 sccm, the processing region is maintained at a pressure of 1 Torr, for an exposure period of 5 minutes. Referring to portion 730 of the bar graph 700, after the soak process, the wafer exhibited a surface roughness of about 1.26 nm. After the over-etch process to remove SiGe, the surface roughness of the wafer increased to about 2.10 nm. After exposure to the hydrogen radical process the surface roughness of the wafer decreased by about 7% to about 1.97 nm.

Figure 8:
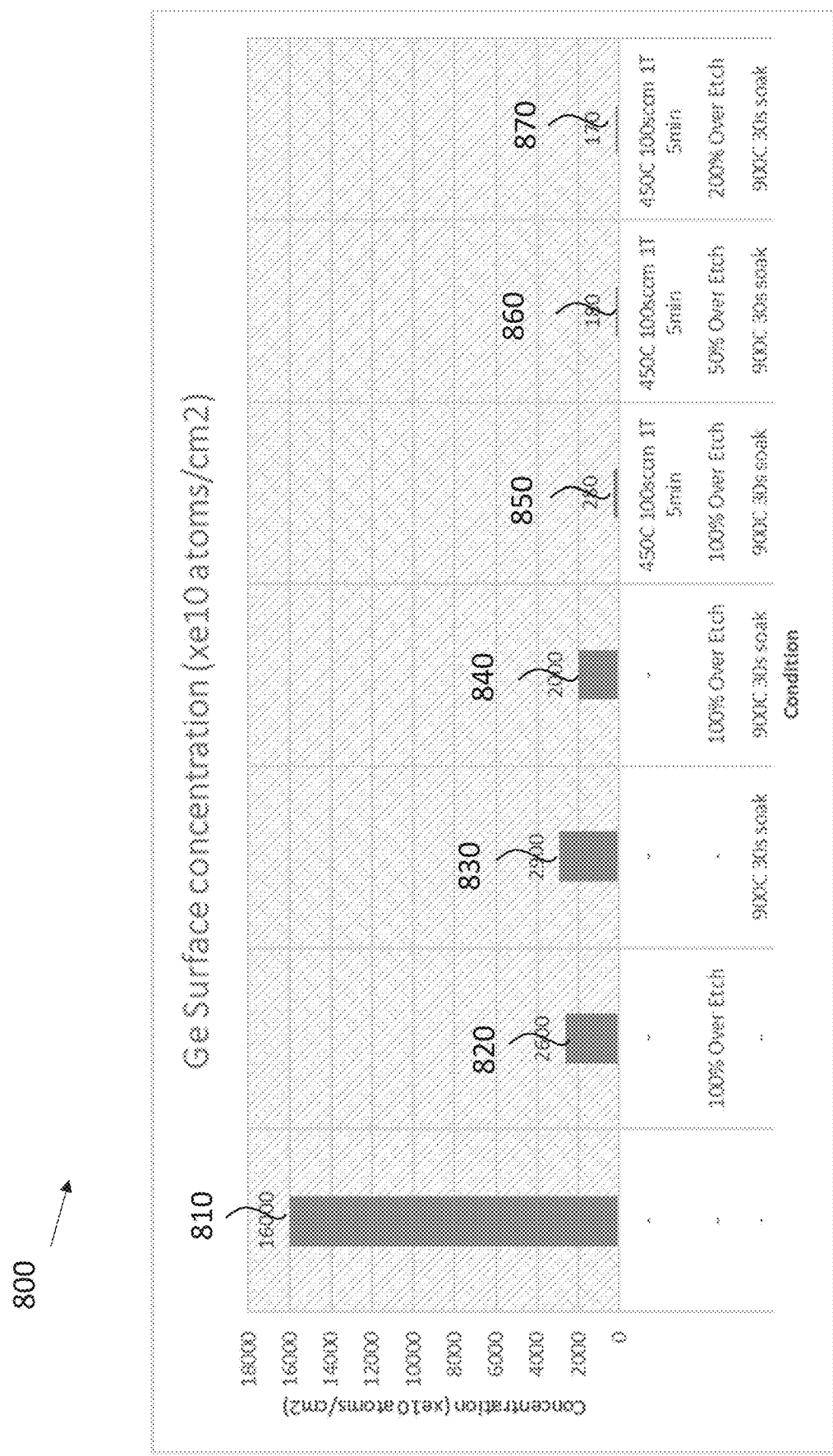
FIG. 8 illustrates another bar graph demonstrating germanium concentration at a silicon surface before and after the treatment methods described herein.

FIG. 8 illustrates another bar graph 800 demonstrating germanium concentration at a silicon surface before and after the treatment methods described herein. The germanium concentration results were obtained using Inductively Coupled Plasma Mass Spectrometry (ICP-MS) to analyze the silicon surfaces. The germanium concentration results are provided in 1×E10 atoms/cm2.

Bar 810 represents germanium concentration (16000) for an initial untreated silicon wafer having a SiGe layer. Bar 820 represents germanium concentration (2600, which is an 83% reduction relative to bar 810), after SiGe removal (100% over-etch). Bar 830 represents germanium concentration (2900, which is an 82% reduction after intermixing (900° C. at 30 seconds)) relative to bar 810. Bar 840 represents germanium concentration (2000, which is an 88% reduction relative to bar 810), after SiGe removal and intermixing. Bar 850 represents germanium concentration (280), which is an 86% reduction relative to bar 810, after SiGe removal (100% over-etch), intermixing (900° C. at 30 seconds), followed by H2 radical treatment (450° C., 100 sccm of H2, 1 Torr, an exposure time of 5 minutes). Bar 850 demonstrates an additional 86% reduction in germanium concentration after H2 radical treatment relative to bar 840. Bar 860 represents germanium concentration (180) after SiGe removal (50% over-etch), intermixing (900° C. at 30 seconds), followed by H2 radical treatment (450° C., 100 sccm of H2, 1 Torr, an exposure time of 5 minutes). Bar 870 represents germanium concentration (170) after SiGe removal (200% over-etch), intermixing (900° C. at 30 seconds), followed by H2 radical treatment (450° C., 100 sccm of H2, 1 Torr, an exposure time of 5 minutes).

Embodiments and all of the functional operations described in this specification can be implemented in digital electronic circuitry, or in computer software, firmware, or hardware, including the structural means disclosed in this specification and structural equivalents thereof, or in combinations of them. Embodiments described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a semiconductor device, comprising:
   thermally treating a substrate having one or more silicon nanosheets formed thereon, the thermally treating the substrate comprising:
      positioning the substrate in a processing volume of a first processing chamber;
      heating the substrate to a first temperature of more than about 250 degrees Celsius;
      generating hydrogen radicals using a remote plasma source fluidly coupled with the processing volume; and
      maintaining the substrate at the first temperature while concurrently exposing the one or more silicon nanosheets to the generated hydrogen radicals.

2. The method of claim 1, wherein generating the hydrogen radicals comprises:
   flowing hydrogen gas into the remote plasma source;
   igniting and maintaining a plasma of the hydrogen gas; and
   flowing an effluent of the remote plasma source into the processing volume, wherein the effluent comprises hydrogen radicals.

3. The method of claim 2, further comprising removing, by use of an ion filter, hydrogen ions from the effluent of the remote plasma source before flowing the effluent into the processing volume.

4. The method of claim 2, wherein the generated hydrogen radicals remove residual germanium from the one or more silicon nanosheets.

5. The method of claim 4, wherein flowing the hydrogen gas into the remote plasma source comprises flowing the hydrogen gas into the remote plasma source at a flow rate in a range from about 50 sccm to about 100 sccm.

6. The method of claim 5, wherein the first temperature is in a range from about 450 degrees Celsius to about 500 degrees Celsius.

7. The method of claim 1, wherein the one or more silicon nanosheets comprise at least three nanosheets and the at least three nanosheets are part of a horizontally stacked gate-all-around nanosheet structure.

8. The method of claim 1, further comprising removing silicon germanium layers from a superlattice structure comprising the silicon germanium layers and silicon layers alternatingly arranged in a plurality of stacked pairs to form the silicon nanosheets, wherein the first processing chamber is connected to a second processing chamber by a transfer chamber disposed therebetween and removing the silicon germanium layers is performed via an etching process in the second processing chamber.

9. A method of forming silicon nanosheets in a transistor device, comprising:
   (a) positioning a substrate in a first processing volume of a first processing chamber, the substrate having a superlattice structure formed thereon, the superlattice structure comprising a plurality of silicon layers and a plurality of silicon germanium layers alternatingly arranged in a plurality of stacked pairs;

(b) removing the plurality of silicon germanium layers from the superlattice structure to form a plurality of silicon nanosheets by exposing the superlattice structure to an etchant that removes silicon germanium at a higher rate than silicon;

(c) positioning the substrate in a second processing volume of a second processing chamber that is connected to the first processing chamber;

(d) heating the substrate to a first temperature of more than about 250 degrees Celsius;

(e) generating hydrogen radicals using a remote plasma source fluidly coupled with the second processing volume; and (f) maintaining the substrate at the first temperature while concurrently exposing the plurality of silicon nanosheets to the generated hydrogen radicals.

10. The method of claim 9, wherein the generated hydrogen radicals remove residual germanium from the plurality of silicon nanosheets.

11. The method of claim 9, wherein generating the hydrogen radicals comprises:

flowing hydrogen gas into the remote plasma source;

igniting and maintaining a plasma of the hydrogen gas; and flowing an effluent of the remote plasma source into the second processing volume, wherein the effluent comprises hydrogen radicals.

12. The method of claim 11, wherein the etchant comprises an ammonia peroxide mixture or a sulfuric acid peroxide mixture.

13. The method of claim 11, further comprising removing, by use of an ion filter, hydrogen ions from the effluent of the remote plasma source before flowing the effluent into the second processing volume.

14. The method of claim 11, wherein flowing the hydrogen gas into the remote plasma source comprises flowing the hydrogen gas into the remote plasma source at a flow rate in a range from about 50 sccm to about 100 sccm.

15. The method of claim 14, wherein the first temperature is in a range from about 450 degrees Celsius to about 500 degrees Celsius.

16. The method of claim 11, wherein the plurality of silicon nanosheets comprise at least three nanosheets and the at least three nanosheets are part of a horizontally stacked gate-all-around nanosheet structure.

17. A method of forming silicon nanosheets in a transistor device, comprising:

forming a superlattice structure on a substrate, wherein the superlattice structure comprises a plurality of silicon layers and a plurality of silicon germanium layers alternatingly arranged in a plurality of stacked pairs;

patterning and etching the superlattice structure to form fins from the superlattice structure, wherein the fins are separated by trenches;

depositing a dielectric material in the trenches to form shallow trench isolation (STI) structures;

exposing sidewalls of the fins by recessing the STI structures to form recessed STI structures;

forming a dummy gate oxide layer over the fins and the recessed STI structure;

forming a dummy metal gate stack over the dummy gate oxide layer;

removing the plurality of silicon germanium layers from the fins to form a plurality of silicon nanosheets by exposing the fins to an etchant that removes silicon germanium at a higher rate than silicon;

heating the substrate to a first temperature of more than about 250 degrees Celsius; and maintaining the substrate at the first temperature while concurrently exposing the plurality of silicon nanosheets to hydrogen radicals, wherein the hydrogen radicals are generated using a remote plasma source.

18. The method of claim 17, wherein the generated hydrogen radicals remove residual germanium from the plurality of silicon nanosheets.

19. The method of claim 17, wherein generating the hydrogen radicals using the remote plasma source comprises:

flowing hydrogen gas into the remote plasma source;

igniting and maintaining a plasma of the hydrogen gas; and flowing an effluent of the remote plasma source into a processing volume, wherein the effluent comprises hydrogen radicals.

20. The method of claim 19, further comprising removing, by use of an ion filter, hydrogen ions from the effluent of the remote plasma source before flowing the effluent into the processing volume.

* * * * *